United States Patent [19]

Ishikawa et al.

[11] Patent Number: 5,256,976

[45] Date of Patent: Oct. 26, 1993

[54] POWER APPARATUS AND METHOD OF LOCATION OF A FAULT IN A POWER APPARATUS ON THE BASIS OF ATTENUATION COEFFICIENTS OF ELECTROMAGNETIC COEFFICIENTS OF FAULT GENERATED ELECTROMAGNETIC WAVES

[75] Inventors: Toshio Ishikawa; Fumihiro Endo; Shuzo Iwaasa; Tomoaki Utsumi; Tokio Yamagiwa; Yoshinori Tagawa, all of Hitachi, Japan

[73] Assignee: Hitachi, Ltd., Tokyo, Japan

[21] Appl. No.: 663,440

[22] Filed: Mar. 1, 1991

[30] Foreign Application Priority Data

Mar. 9, 1990 [JP] Japan .................................. 2-56368

[51] Int. Cl.$^5$ ...................... G01R 31/08; H02G 15/28
[52] U.S. Cl. ..................... 324/522; 324/520; 324/536; 324/554; 324/557; 174/11 R; 364/492
[58] Field of Search ............... 324/500, 520, 522, 529, 324/535, 536, 543, 544, 551, 555, 557; 174/11 R; 364/482, 483, 492

[56] References Cited

U.S. PATENT DOCUMENTS

| 4,231,258 | 11/1980 | Menju et al. | 174/11 R |
|---|---|---|---|
| 4,446,420 | 5/1984 | Drouet | 324/522 |
| 4,466,071 | 8/1984 | Russel, Jr. | 364/482 X |
| 4,882,682 | 11/1989 | Takasuka et al. | 324/557 |
| 5,107,447 | 4/1992 | Ozawa et al. | 324/536 X |
| 5,146,170 | 9/1992 | Ishikawa et al. | 324/536 |

FOREIGN PATENT DOCUMENTS 62-285879  4/1987  Japan ................................... 324/535

Primary Examiner—Gerard R. Strecker
Assistant Examiner—Diep Do
Attorney, Agent, or Firm—Antonelli, Terry, Stout & Kraus

[57] ABSTRACT

A power apparatus has a network formed by a plurality of interconnected components being, e.g., one or more high voltage conductors in a casing of a metal filled with an insulating gas. Detectors are provided which detect electromagnetic waves, which are generated if there is a fault. The electromagnetic waves are analyzed to detect the location of the fault. The analysis may make use of attenuation coefficients corresponding to each component of the network to extrapolate between detectors on either side of the fault and/or to compare with predetermined wave strengths. A map of the network may be stored in a suitable memory to assist in the calculation of the fault location, and the memory may also store the attenuation coefficients themselves. The location of the fault may then be displayed by a suitable display, to give the time variation of the fault.

32 Claims, 20 Drawing Sheets

FIG. 4
| element no. | component | size of component |
|---|---|---|
| 1 | BUS | 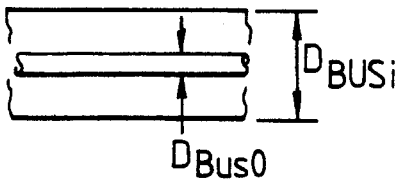 |
| 2 | CB | 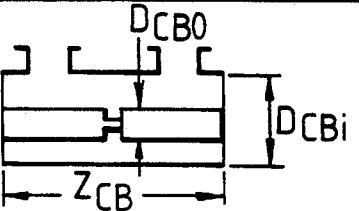 |
| 3 | DS | 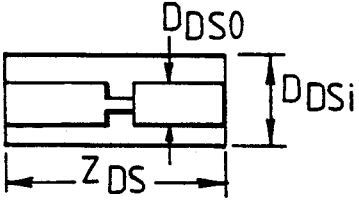 |
| 4 | TB | 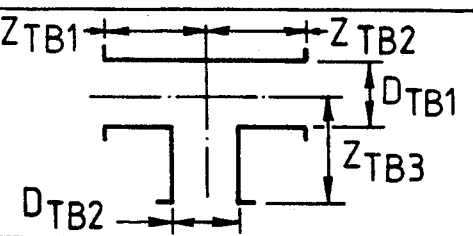 |
| 5 | SP | 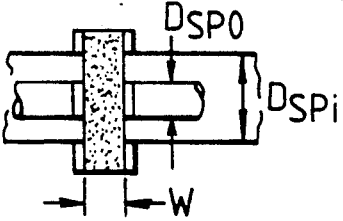 |

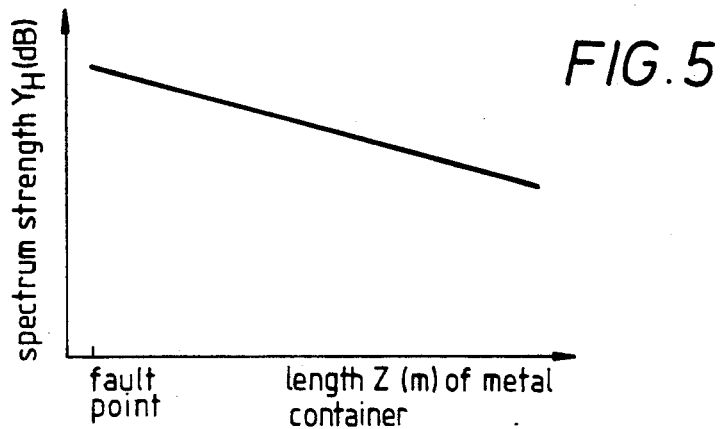
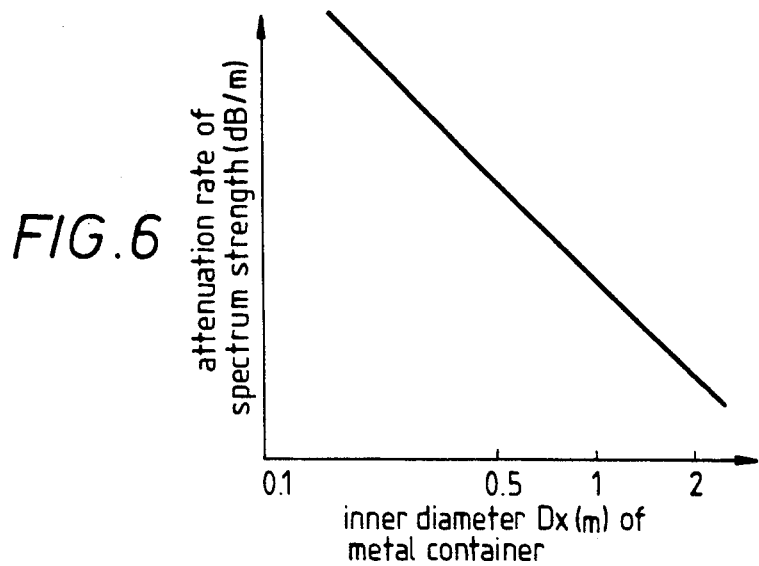
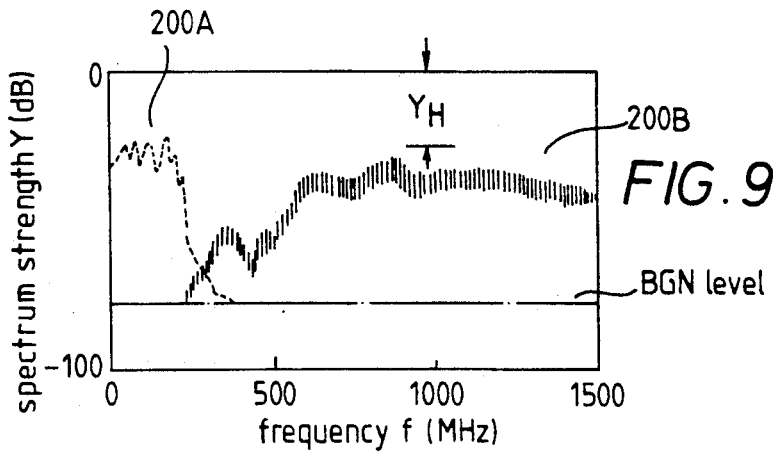

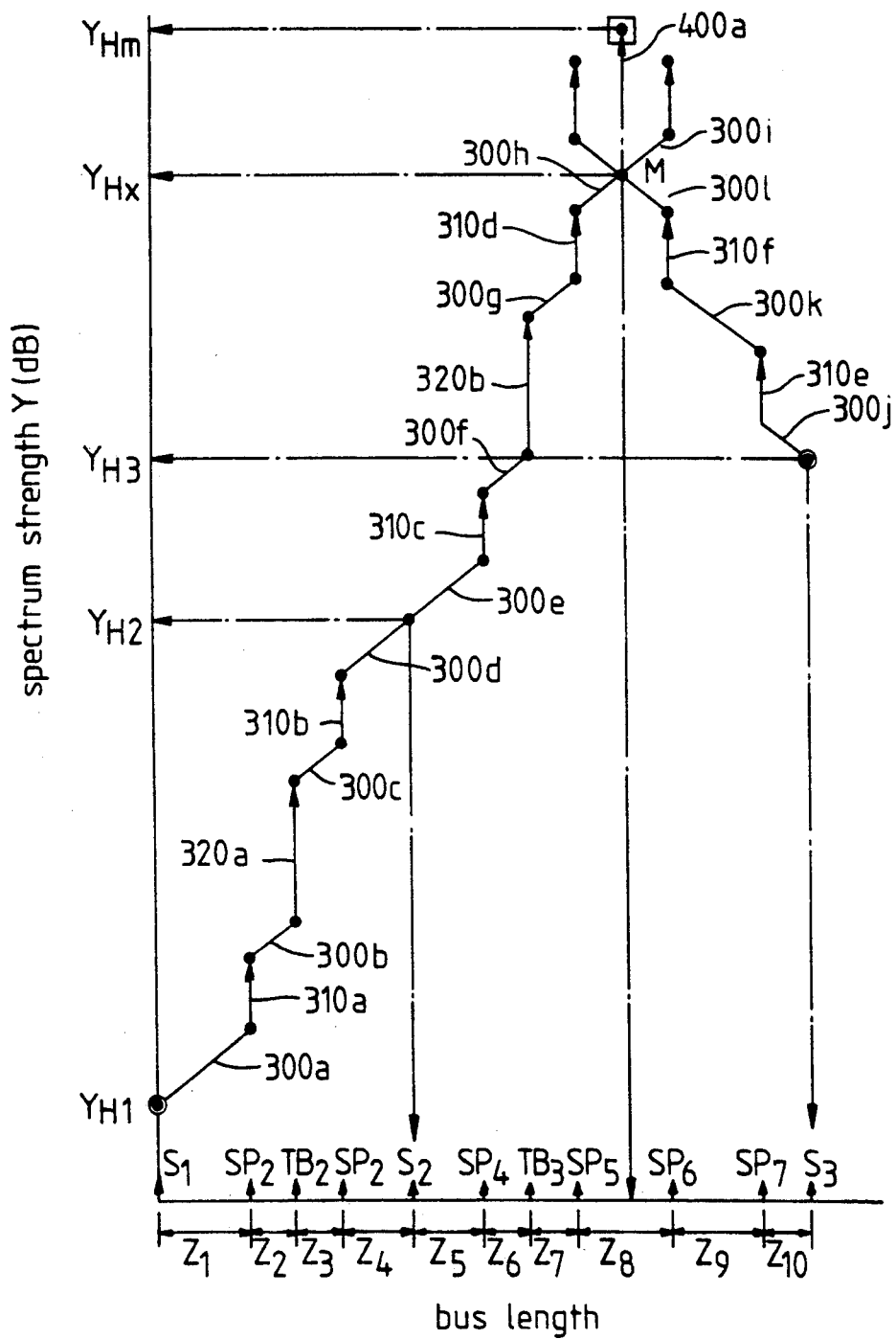

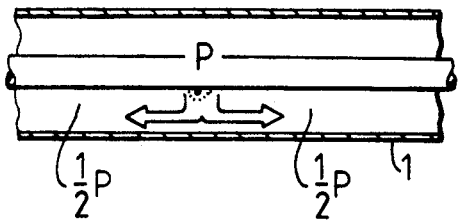
FIG. 11
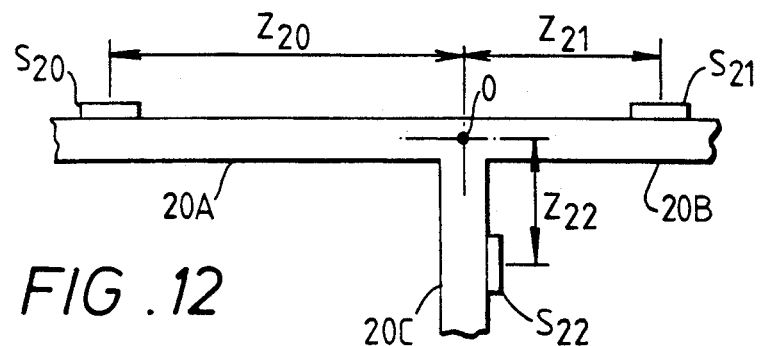
FIG. 12
FIG. 20
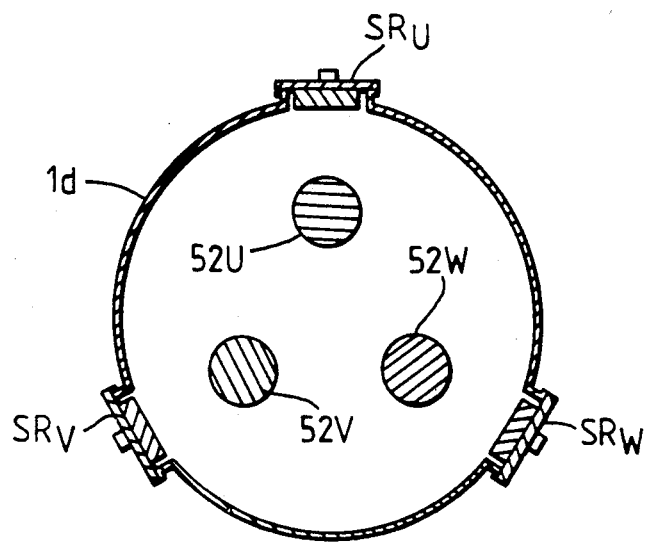

| partial discharge generating position | treatment method |
|---|---|
| insulator | ① |
| gas filled space | ② |

FIG. 36

| partial discharge generating position | treatment method | |
|---|---|---|
| | position stationary | position mobile |
| insulator | ①-1 | ①-2 |
| gas filled space | ②-1 | ②-1 |

FIG. 37

| partial discharge generating position | | treatment method | |
|---|---|---|---|
| | | position stationary | position mobile |
| insulator | surface | ①-1-1 | ①-2-1 |
| | inside | ①-1-2 | ①-2-2 |
| gas filled space | high voltage conductor portion | ②-1-1 | ②-2-1 |
| | high voltage shield portion | ②-1-2 | ②-2-2 |
| | contact portion | ②-1-3 | ②-2-3 |

POWER APPARATUS AND METHOD OF LOCATION OF A FAULT IN A POWER APPARATUS ON THE BASIS OF ATTENUATION COEFFICIENTS OF ELECTROMAGNETIC COEFFICIENTS OF FAULT GENERATED ELECTROMAGNETIC WAVES

BACKGROUND OF THE INVENTION

1. Field of the Invention

The present invention relates to a power apparatus, and particularly to a power apparatus comprising a plurality of interconnected identifiable components defining a network. The present invention also relates to a method of locating a fault or other abnormality (hereinafter referred to generally as a "fault") in such a power apparatus.

2. Summary of the Prior Art

It is known to form a power apparatus by supporting one or more high voltage conductors in a casing of e.g. a metal, and filling that casing with insulating gas. The gas may be, for example, $SF_6$. Such a power apparatus is used, for example, in a power sub-station for electricity transmission.

The casing forms a network, and within this network it is possible to identify a plurality of interconnected components. The network will have a large number of relatively straight casing sections, but will also normally have insulation spacers, T-junctions, disconnecting switches, circuit breakers and other items of the power apparatus which are necessary for its function. Of course, since the components form a network, the separation of the identifiable components discussed above may not correspond to physical divisions, since, e.g., a T-junction may be integrally connected to the straight sections of the casing leading from the junction, but nevertheless such a T-junction is identifiable as such, and thus the components are identifiable within the network.

Although great care is taken in the construction of such a power apparatus, it is possible for an abnormality to occur in the insulation within the apparatus, and insulation breakdown could lead to a serious accident. Therefore, it is necessary to identify the site of a potential breakdown as early as possible, and with high precision.

When a fault begins to develop in the insulation in such a network, sound waves are generated, and it is possible to arrange a plurality of sound detectors within the network, to detect the sounds generated by a fault. An example of such an arrangement was disclosed in the article entitled "Development of Compact 500 kV 8000A Gas Insulated Transmission Line-Dust Control During Field Jointing and Method for Detecting Conductive Particles" by K. Kaminaga et al in Paper 87 WM003-7 from the IEEE.

It is also known that a fault developing in such a network generates vibration waves, and again it is possible to provide vibration detectors to detect these waves.

Finally, it is known that the development of a fault generates electromagnetic waves, and JP-A-1-287475 and equivalents thereof disclosed the use of such electromagnetic waves for fault location.

SUMMARY OF THE INVENTION

Fault location systems based on the detection of accoustic waves or vibration have the problem that existing detectors have a relatively short detection range. This means that a large number of such detectors must be located within the network. Of course, it is then readily possible to determine the distance between the fault and the pair of detectors on lying one on each side of that fault, because the distances involved are short, but the large number of detectors needed is troublesome and expensive.

Therefore, the present invention seeks to make use of electromagnetic waves. In the applicants co-pending U.S. application Ser. No. 07/535,069, filed Jun. 28, 1990, now U.S. Pat. No. 5,146,170, corresponding to Japanese application filing number 1-149428, there was disclosed an arrangement in which the output of each detector detecting electromagnetic waves was analyzed to determine the frequency spectrum of the waves, and then, for at least the pair of detectors which lie one on either side of the fault, an attempt was made to calculate the location of the fault on the basis of an attenuation coefficient. If the calculation to determine the location of the fault was based on information from two detectors only, then the attenuation coefficient was a single, predetermined, value. If three detectors were used, two on one side of the fault and one on the other, then an attenuation coefficient was obtained by comparison of the outputs of the two detectors on one side of the fault. This attenuation coefficient was used to extrapolate towards the fault from those two detectors, and the same attenuation coefficient was used to extrapolate from the detector on the other side of the fault, i.e., towards the fault. Where four detectors were used, this enabled two attenuation coefficients to be obtained from comparison of the signals from the two detectors on each side of the fault, and then location of the fault was determined on the basis of extrapolation from those measurement, using the two attenuation coefficients found. Thus, in all those cases, extrapolation was based on an average attenuation coefficient between the detectors, whether predetermined or calculated in each case.

However, the applicants have now realised that the attenuation coefficient of each type of component of the network may be different. Thus, the use of an averaged attenuation coefficient leads to inaccuracy in the location of the fault. Since the aim of using detectors which detect electromagnetic waves is to have a relatively small number of such detectors, it is important that the location of the fault should be determined accurately.

Therefore, the present invention proposes to make use of information about the components themselves.

In a first aspect, the present invention proposes that attenuation coefficients corresponding to each identifiable component be used in the determination of the location of the fault. For each type of component, the attenuation coefficient can be determined either theoretically or empirically, and this may then be used to extrapolate between detectors measuring electromagnetic signal strengths towards a fault, from at least the pair of detectors which lie one on either side of the fault.

In a second aspect, the present invention proposes that attenuation coefficients corresponding to each of the identifiable components are stored in suitable storage means. Thus, a database of the attenuation coefficient of each component of the network may be established.

In a third aspect of the present invention, it is proposed that a map corresponding to the identifiable components of the network be stored, and such a map be used to locate the fault. Again, a database may store information concerning the construction of each component of the network, and these may be combined to form a network map which itself may be stored.

In a fourth aspect of the present invention it is proposed that the location of the fault be displayed in terms of the time variation thereof on, e.g., a suitable display. Such a time variation gives the operator useful information.

In a fifth aspect of the present invention, it is proposed that predetermined electromagnetic wave strengths be stored for each of the detectors, and the electromagnetic wave strengths detected by each detector compared with the corresponding predetermined strength. Any difference can then be used to calculate the location of the fault.

Each of the above aspects of the present invention may be embodied individually, or in any combination thereof.

Preferably, to determine the location of the fault, propagation curves of the electromagnetic waves are calculated for at least the pair of detectors which lie one on either side of the developing fault, and the intersection point of those propagation curves is identified. This calculation will normally make use of the attenuation coefficients of each component between the detectors, e.g., from the attenuation coefficient storage means, and use may also be made of the map of the circuit construction. When a fault is detected, an alarm may be triggered.

Each of the aspects of the present invention discussed above relates both to a power apparatus involving the features of that aspect, and a method of locating a fault in the manner proposed in that aspect. Furthermore, the present invention also relates to a fault location system for a power apparatus, which fault location system comprises the components used to achieve any of the above aspects before being installed in the power apparatus itself.

BRIEF DESCRIPTION OF THE DRAWINGS

Embodiments of the invention will now be described in detail, by way of example, with reference to the accompanying drawings, in which:

FIG. 4 shows examples, of data to be stored in a database unit, the data representing components of parts of the network of the network of an apparatus, according to the present invention;

FIG. 5 and FIG. 6 are respectively attenuation characteristics of the propagation of an electromagnetic wave relative to the length and diameter of a metal container;

FIG. 9 is a frequency spectra characteristic;

FIG. 10 is a diagram showing an example of a method of fault location used in the present invention;

FIG. 11 shows the propagation of an electromagnetic wave from a partial discharge generation point;

FIG. 12 shows an example of a detector arrangement at a branched portion;

FIG. 20 is a cross sectional view in the radial direction of a gas insulated electric apparatus using a fault location device according to a fourth embodiment of the present invention;

FIG. 35, FIG. 36, and FIG. 37 are respectively view showing corresponding processing methods to the fault location results.

DETAILED DESCRIPTION

Figure 1:
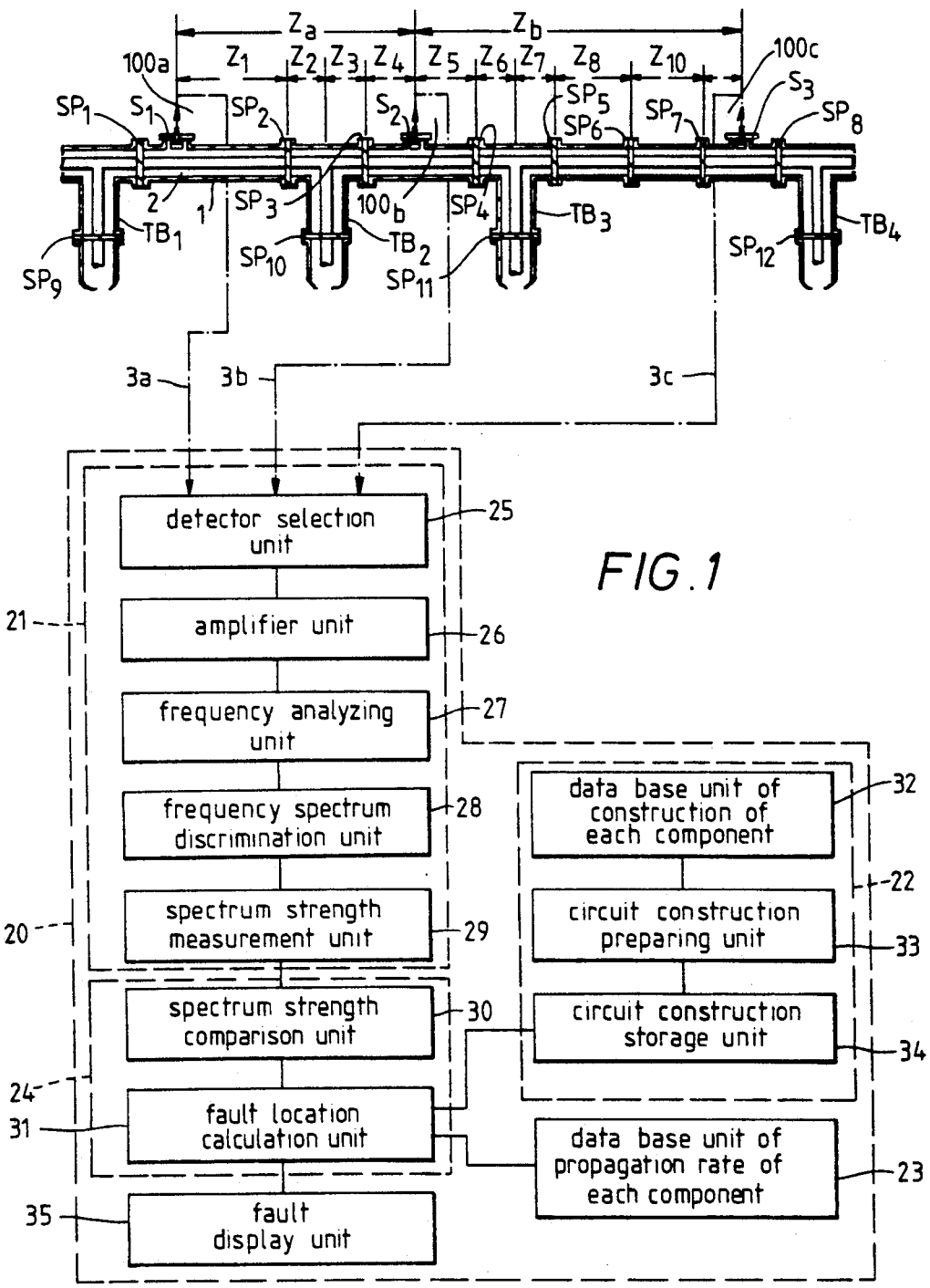
FIG. 1 is a block diagram showing a fault location device for a gas insulated electric apparatus, being a first embodiment of the present invention.

FIG. 1 shows the construction of a gas insulated bus being part of a power apparatus of gas insulation type according to the present invention.

In FIG. 1, a tubular metallic container 1, forming a casing of the apparatus, supporting a high voltage conductor 2 via insulation supporting members $SP_1$ to $SP_{12}$ such as insulation spacers. The metal container 1 is filled with a gas having insulating properties such as $SF_6$ gas. Within this metallic container 1, there are a plurality of detectors $S_1$, $S_2$ and $S_3$. These detectors $S_1$, $S_2$ and $S_3$ are located at positions 100a, 100b and 100c with intervals Za and Zb respectively. The signals detected by the respective detectors $S_1$, $S_2$ and $S_3$ are provided to an analysing device 20 via transmission cables 3a, 3b and 3c.

Figure 2:
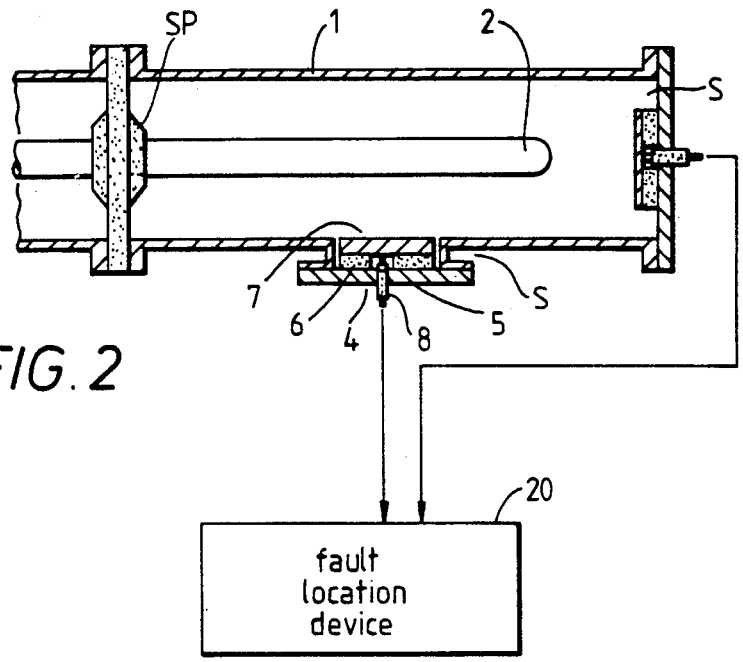
FIG. 2 is an enlarged view of the detector region of the device shown in FIG. 1.

FIG. 2 shows the detailed construction of the detectors $S_1$, $S_2$ and $S_3$. In FIG. 2, a detecting electrode 7 is supported on the inner face of an end plate 5 for a hand hole 4 formed in the metallic container 1 via insulator 6. This detecting electrode 7 is electrically insulated from the end plate 5 by an insulating terminal 8 and extends outside from the metallic container 1 while maintaining the container 1 gas tight. The end of the insulation terminal 8 is connected to the analysing device 20. The detecting electrode 7 is arranged opposite to the high voltage conductor 2 supported by the insulating supporting member SP within the metal container 1.

Now, returning to FIG. 1, the analysis device 20 has means 21 for obtaining spectrum strengths via detected signals from a plurality of the detectors $S_1$ to $S_3$, means 22 for discriminating the circuit network construction of the gas insulated electric apparatus, a database unit 23 for electromagnetic wave propagation rates (attenuation coefficients) for every component of the container 1 for discriminating the electromagnetic wave propagation rate of every component in the circuit network construction, means 24 for locating the fault position corresponding to the point of the maximum spectrum strengths, the location of the detectors, the circuit network construction and the propagation rate for every component, and a display unit 35 for displaying the location of the fault.

The spectrum strength obtaining means 21 has a detector selection unit 25 which selects the respective detectors $S_1$ to $S_3$, an amplifier which amplifies the signals from the detector selection unit 25, a frequency analyzing unit 27 which analyzes the frequency components of the amplified output signals from the amplifier 26, a frequency spectrum discrimination unit 28 which determines whether the frequency spectrum analyzed in the frequency analyzing unit 27 contains an abnormal signal in a high frequency region and a spectrum strength measurement unit 29 which measures the spectrum strength of the abnormal signal from the discrimination unit 28.

The circuit construction discriminating means 22 has a database unit 32 which stores the construction of every component of the circuit network such as the metal container 1 forming a circuit for the apparatus, the insulation support members $SP_1$ to $SP_{12}$, and branch portions $TB_1$ to $TB_4$, and a circuit construction preparing unit 33 which prepares a circuit construction of the apparatus, based on the information from the database unit 32. A circuit construction storage unit 34 stores the prepared circuit construction.

Figure 3:
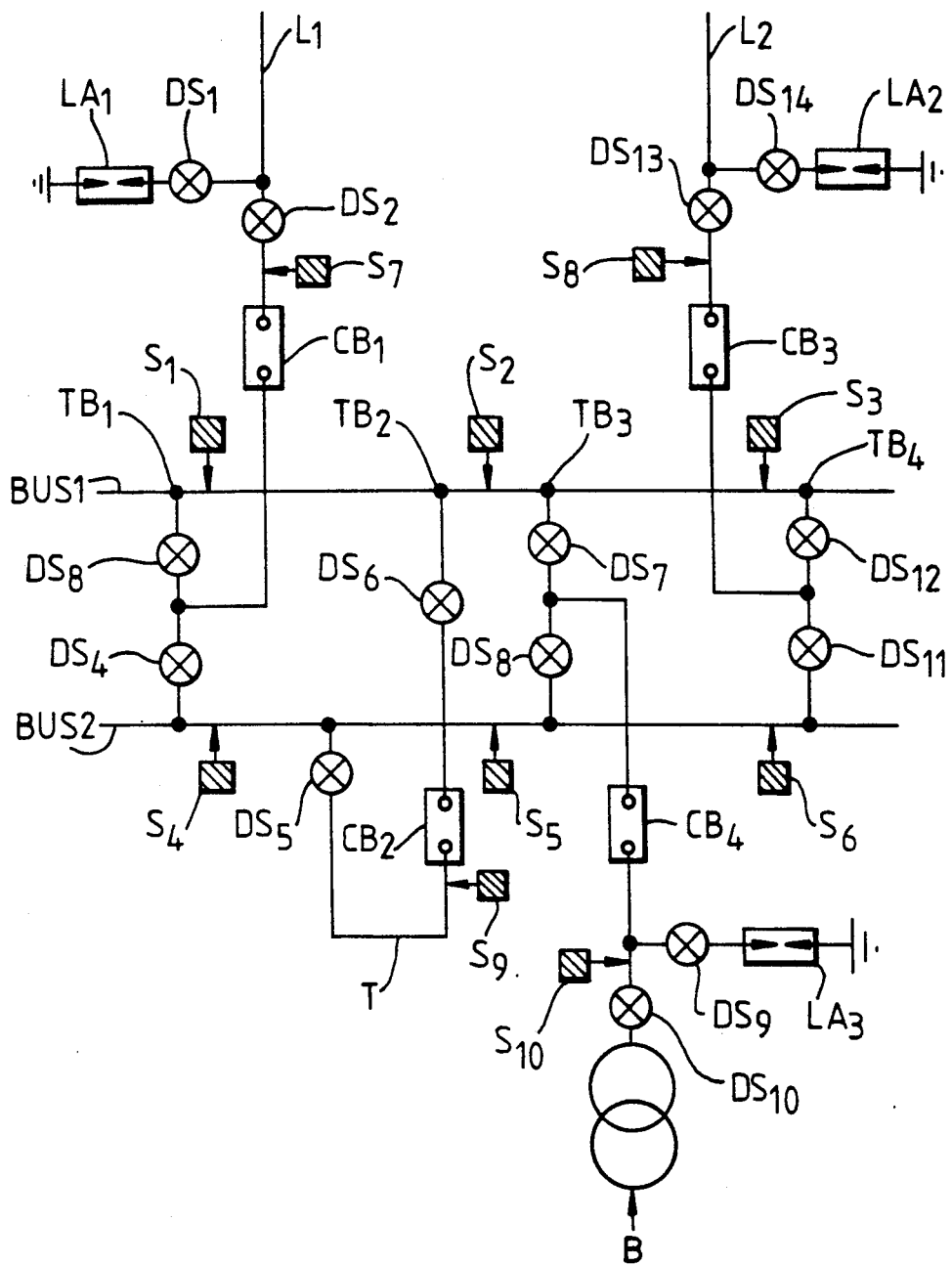
FIG. 3 is a single line connection diagram of a gas insulated electric apparatus in which the present invention is used for locating the positions of a fault.

The circuit construction of a gas insulated electric apparatus in a transformer station is shown in FIG. 3 in the form of a single phase connection diagram, which is stored in the circuit construction discriminating means 22. Thus, line units $L_1$, $L_2$, a tie unit bus T, and a bank unit bus B are respectively connected to a main double buses BUS1, BUS2. Each unit is formed by the combination of disconnecting switches $Ds_1$ to $Ds_{14}$, circuit breakers $CB_1$ to $CB_4$, arresters $LA_1$ to $LA_3$, a transformer and a connecting bus (a metal container) connecting these components. The circuit construction storage unit 34 stores the circuit construction shown in FIG. 3 and the construction database unit 32 stores every construction component. The sizes of the respective components forming the circuits in the form, for example, shown in FIG. 4, are inputted as data for the database. Thus, for example, for component No. 1 shown in FIG. 4, the data corresponds to the inner diameter $D_{BUS1}$ of the metal container as the bus size forming the circuit, and the outer diameter $D_{BUS0}$ of the high voltage conductor. For component No. 2, the data are the inner diameter $D_{CBi}$ and length $Z_{CB}$ of the metal container 1 forming a circuit breaker CB and the outer diameter $D_{CBO}$ of the high voltage part. For component No. 3, the data are the inner diameter $D_{DSi}$ and length $Z_{DS}$ of the metal container 1 forming a disconnecting switch Ds and the outer diameter $D_{DSO}$ of the high voltage part. For component No. 4, the data are the lengths of the branch portions $Z_{TB1}$, $Z_{TB2}$, $Z_{TB3}$ and the inner diameters $D_{TB1}$, $D_{TB2}$, of the metal container. For component No. 5 the data include the inner diameter $D_{SPi}$ of the connecting bus representing the size of the insulation supporting member SP, the outer diameter $D_{SPO}$ of the high voltage conductor and the thickness W of the insulation support member SP. Based upon the data for every component, the construction of the circuit shown in FIG. 3 can be determined. In the circuit shown in FIG. 3, when an abnormal signal is detected at the detectors $S_1$, $S_2$, $S_3$ in the main BUS1, based upon the detailed construction in the sectional area, the location of the fault can be obtained by the circuit construction discriminating means 22 shown in FIG. 1.

Returning to FIG. 1, the propagation rate database unit 23 for every component for the electromagnetic wave amount discriminating means of the respective construction components part is formed by inputting the propagation rate (attenuation coefficient) of every construction component part, e.g., as the attenuation rate per unit length in the bus portion $\alpha_{BUS}$, the amount of attenuation for each insulation supporting member $\alpha_{SP}$, the amount of attenuation per one bus branch portion $\alpha_{TB}$ and the amount of attenuation per unit length of the circuit breaker and disconnecting switch $\alpha_{CB}$ and $\alpha_{DS}$.

The electromagnetic wave emitted by a partial discharge at a fault has an attenuation characteristic dependent on distance from the abnormality generation point (fault site) as shown in FIG. 5 during propagation thereof in the metal container 1 due to, e.g., the influence of the tube wall resistance of the metal container 1, and since the amount of attenuation is proportional to the propagation thereof in the metal container, this is represented by attenuation rate per unit length. The attenuation characteristic of the electromagnetic wave changes in dependence on the inner diameter of the metal container 1 as shown in FIG. 6, and in general the inner diameters of the bus, circuit breaker, and disconnecting switch are not the same even within the same line voltage system and may also change in dependence on the line voltages so that database is formed by selecting the attenuation rate $\alpha_{BUS}$ of the bus, the attenuation rate $\alpha_{CB}$ of the circuit breaker and the attenuation rate $\alpha_{DS}$ of the disconnecting switch in dependence upon the respective inner diameters.

Figure 7:
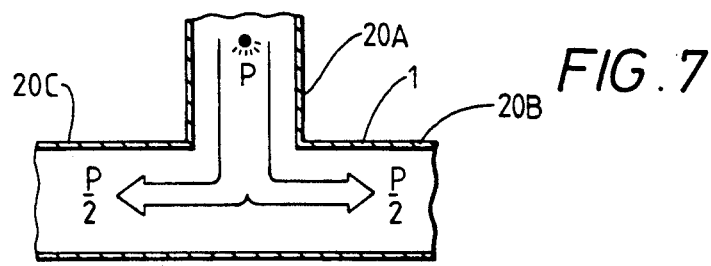
FIG. 7 and FIG. 8 are respectively explanatory views showing attenuation characteristics of electromagnetic wave propagation in a branched component and a component being an insulation supporting member.

As shown in FIG. 7, when the metal container is constituted in branches by bus tubes 20A, 20B and 20C, an electromagnetic wave having a power P which propagates from one side of the bus tube 20A as shown in the drawing is divided into two at the branch point. For this reason, attenuated electromagnetic waves having power ½ P propagate respectively to the bus tubes 20B, 20C. Therefore, the attenuation rate $\alpha_{TB}$ at the branch point, ½ P per one point ($= -3$ dB/point) is inputted as data for the propagation rate.

Figure 8:
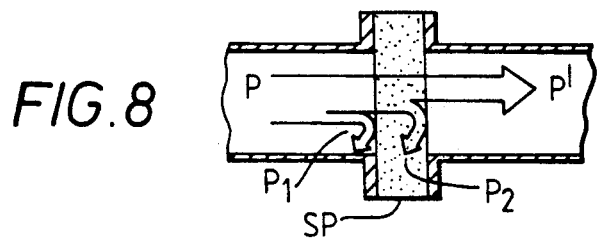

As shown in FIG. 8, when an electromagnetic wave having power P passes through the insulation supporting member SP, power losses $P_1$, $P_2$ occur at the surfaces of the insulation supporting member SP due to impedence mismatching. Thus, the power P' after passing through the insulation supporting member SP is reduced to $P' = P - (P_1 + P_2)$, and the attenuation $\alpha_{SP} = P_1 + P_2$ at the insulation supporting member SP is inputted as data for the propagation rate. Hence, for every component, the propagation data are stored in the propagation rate database unit 23.

Returning to FIG. 1, the abnormal position location means 24 has a spectrum strength comparison unit 30 which compares the spectrum strength of abnormal signals from the respective detectors $S_1$ to $S_3$, and a fault location calculating unit 31 which obtains the maximum spectrum strength based upon the information from the comparison unit 30, the information from the circuit construction discriminating means 22 and the information from the propagation rate database unit 23 from every component, and locates the fault position by extrapolation from the locations of the detectors to the point of the maximum spectrum strength. This result can be indicated in various ways. However, in this embodiment, the result is displayed on a display unit 35.

The discrimination of the partial discharge signals the analysis device 20 is carried out by using the frequency spectrum pattern shown in FIG. 9. Thus, a partial discharge in the metal container 1 of the gas insulated electric apparatus contains frequency components of a wide band from low to high frequency, as shown by solid lines in FIG. 9. As shown by spectrum 200B high frequency components more than 500 MHz are prominent, in contrast to external noises such as partial discharge caused outside the gas insulated electric apparatus, shown by dotted spectrum 200A, in which low frequency components less than 500 MHz are prominent.

Accordingly, when there is a high frequency component more than 500 MHz in the spectrum from the respective detectors, it is evident that there is an inner partial discharge.

Therefore, with the spectrum strength obtaining means shown in FIG. 1, the spectrum strengths $Y_{H1}$, $Y_{H2}$ and $Y_{H3}$ of high frequency components are obtained from the spectra obtained from the respective detectors $S_1$, $S_2$ and $S_3$. Thereafter, via means 22, 23 and 24 shown in FIG. 1, electromagnetic wave propagation curves are obtained from the location data of the respective detectors, the location data of the respective components and the propagation rate data (attenuation coefficients) of the respective components. The electromagnetic wave propagation curves are obtained by reverse-calculating successively the propagation at respective components based upon the maximum spectrum strength obtained by the respective detectors. Then, a point M corresponding to the maximum spectrum strength is obtained, and a length from the origin corresponding to the point M then corresponds to the location of the partial discharge. Propagation by the respective construction components are calculated based upon maximum spectra $Y_{H1}$, $Y_{H2}$ and $Y_{H3}$ of the detectors $S_1$, $S_2$ and $S_3$ and correspondending to the positions of the respective components between the respective detectors. The attenuation curves of the propagation in the metal container portions are obtained by multiplying the propagation rate $\alpha_{BUS}$ of the metal container portions with the respective lengths $Z_1$, $Z_2$, $Z_3$, $Z_4$, $Z_5$, $Z_6$, $Z_7$, $Z_8$, $Z_9$ and $Z_{10}$ of the respective metal containers $S_1$ to $SP_2$, $SP_2$ to $TB_2$, $TB_2$ to $SP_3$, $SP_3$ to $S_2$, $S_2$ to $SP_4$, $SP_4$ to $TB_3$, $TB_3$ to $SP_5$, $SP_5$ to $SP_6$, $SP_6$ to $SP_7$, $SP_7$ to $S_3$ as shown by attenuation curves in the respective metal containers 300a, 300b, 300c, 300d, 300e, 300f, 300g, 300h, 300i, 300j, 300k, 3001. The respective attenuations at the respective insulation supporting members $SP_2$, $SP_3$, $SP_4$, $SP_5$, $SP_6$ and $SP_7$ are obtained as attenuation characteristics 310a, 310b, 310c, 310d, 310e and 310f based upon the attenuations $\alpha_{SP}$ of one piece. The attenuation at the branch portions $TB_2$ and $TB_3$ of the metal container are obtained as attenuation characteristics 320a and 320b based upon the attenuation $\alpha_{TB}$ at the branch point. From the propagation curves thus obtained, point M at which the spectrum strength becomes maximum is obtained. At the same time, the amount or intensity of the partial discharge $Y_{HX}$ at the length X can also be obtained.

As shown in FIG. 11, when a partial discharge having power P occurs in the metal container 1, its electromagnetic wave has a characteristic which attenuates the power to ½ P and propagates in both directions. Thus, a spectrum strength in which attenuation characteristic 400a derived from the attenuation $\alpha_{ST}$ at the generating point is added to the calculated intensity of the partial discharge, so that intensity the at the length X is obtained accurately.

In the first embodiment, fault location is performed, in which variations in the propagation amounts (attenuation coefficients) for the respective construction components in the gas insulated electric apparatus is taken into account, so that the location and the intensity of the fault can be determined with an extreme precision.

For the analysing device 20, when abnormal signals are detected, the fault position is located in a manner as explained above, based upon the maximum spectrum of the adjacent detector group containing the detectors exhibiting maximum spectrum strength. However, for simplifying the processing it is preferable to locate the fault based upon information from as few detectors as possible. One such example is explained hereinbelow. In the space as shown in FIG. 10 between the detector $S_1$ and the detector $S_2$ where no partial discharge occurs, the difference $Y_{H2\text{-}1}$ between the maximum spectrum strength $Y_{H1}$ of the detector $S_1$ and the maximum spectrum $Y_{H2}$ of the detector $S_2$, and the sum $\alpha_{2\text{-}1}$ of the propagation of the respective components between the detector $S_1$ and the detector $S_2$ are represented by the following equations.

$$Y_{H2-1} = Y_{H2} - Y_{H1} \tag{1}$$

$$\alpha_{2-1} = \alpha_{BUS}(Z_1 + Z_2 + Z_3 + Z_4) + 2 \cdot \alpha_{SP} + \alpha_{TB} \tag{2}$$

The difference $Y_{H2\text{-}1}$ of the spectrum strength and the sum $\alpha_{2\text{-}1}$ of the electromagnetic propagation are related by:

$$Y_{H2-1} = \alpha_{2-1} \tag{3}$$

The difference in spectrum strength $Y_{H3-2}$ and the sum of the amount of electromagnetic wave propagation $\alpha_{3-2}$ in the space containing the partial discharge between the detectors $S_2$ and the detector $S_3$ is expressed as follows;

$$Y_{H3-2} = Y_{H3} - Y_{H2} \tag{4}$$

$$\alpha_{3-2} = \alpha_{BUS}(Z_5 Z_6 + Z_7 + Z_8 + Z_9 + Z_{10}) + 4 \cdot \alpha_{SP} + \alpha_{TB}$$

The relationship between the spectrum strength difference $Y_{H3-2}$ and the sum of the electromagnetic wave propagation $\alpha_{3-2}$ is as follows:

$$Y_{H3-2} \neq \alpha_{3-2} \tag{6}$$

Accordingly, when abnormal signals are detected at a plurality of detectors, the maximum spectrum strength difference $Y_{Hn-m}$ between the adjacent detectors, and the sum $\alpha_{n-m}$ of the propagation of the respective components are obtained, and a section of $Y_{Hn-m} \neq \alpha_{n-m}$ is determined. Electromagnetic wave propagation curves from the two detectors defining the section based upon the maximum spectrum strengths of the two detectors for the method shown in FIG. 10 are obtained and the position corresponding to the crossing point of these curves corresponds to the fault location. When there are a small number of differences between the spectrum strength difference $Y_{Hn-m}$ of the respective detectors and the sums $\alpha_{n-m}$ of electromagnetic wave propagation the section in which the amount of $|Y_{Hn-m} - \alpha_{n-m}|$ is maximum can be discriminated to include the fault location.

With such a location method, the processing is extremely simple and the fault location is determined using the minimum number of detectors. Therefore, the number of detectors to be provided may be reduced.

In the above embodiments, a linear gas insulated electric apparatus as shown in FIG. 1 is considered. However a gas insulated electric apparatus which is actually used in a transforming station may have many branch points. Thus, an example in which fault location occurs in such a construction will now be explained.

FIG. 12 shows a gas insulated electric apparatus in which three bus tubes 20A, 20B and 20C are connected so as to cross each other perpendicularly. In this drawing, there is a detector $S_{20}$ for the bus tube 20A at a position having a distance $Z_{20}$ from the crossing point O of the respective buses. Also, in the bus tube 20B, there is a detector $S_{21}$ at a position having a distance $Z_{21}$ from the crossing point O. In the bus tube 20C there is a detector $S_{22}$ at the position having a distance $Z_{22}$ from the crossing point O. For ease of explanation the distances from the crossing point O to the respective detectors $S_{20}$, $S_{21}$ and $S_{22}$ are considered to be $Z_{20} = Z_{21} Z_{22}$. Also to simplify the explanation, the respective structures of every component are omitted. The construction of the analysing device 20 is the same as that shown in FIG. 1.

When locating a fault position with such a construction, the respective maximum spectrum strengths $YH_{20}$, $YH_{21}$ and $YH_{22}$ are first obtained from the three detectors $S_{20}$, $S_{21}$ and $S_{22}$ and then the respective detected level difference vinyl $\Delta Y_1 = Y_1 = Y_{H20} - Y_{H21}$, $\Delta Y_2 = Y_{H20} - Y_{H22}$, $\Delta Y_3 = Y_{H21} - Y_{H22}$ between the detectors $S_{20}$ and $S_{21}$, and the detectors $S_{20}$ and $S_{22}$ and the detectors $S_{21}$ and $S_{22}$ are obtained. The propagation $\alpha_1$ between the crossing point O and the detector $S_{20}$, the propagation amount $\alpha_2$ between the crossing point O and the detector $S_{21}$ and the propagation amount $\alpha_3$ between the crossing point O and the detector $S_{22}$ are obtained by the method indicated by equation (2).

The difference $\Delta \alpha_{1-2} = \alpha_1 - \alpha_2$ of the propagation from the crossing point O to the detector $S_{20}$ and to the detector S21 and the detected level difference $\Delta Y_1$ is compared, and when $\Delta \alpha_{1-2} = \Delta Y_1$, it can be seen that there is no fault within the bus tube between the detector $S_{20}$ and the detector $S_{21}$. However, when $\alpha_{1-2} \neq \Delta Y_1$, there is a fault within the bus tube between the detector $S_{20}$ and the detector $S_{21}$. In the same manner, via comparison of the difference $\Delta \alpha_{1-3} = \alpha_1 - \alpha_3$ of the propagation from the crossing point O to the detector $S_{20}$ and to the detector $S_{22}$ with the detected level difference $\Delta Y_2$, and of the difference $\Delta \alpha_{2-3} = \alpha_2 - \alpha_3$ of the propagation from the crossing point O to the detector $S_{21}$ and to the detector $S_{22}$ with the detected level difference $\Delta Y_3$, it is possible to determine in which bus tube the fault lies. Specifically accurate fault location is achieved by selecting the two detectors of the bus where the fault exists and determining the position of a partial discharge with the orientation method explained in connection with FIG. 10. Then, when $\Delta \alpha_{1-2} = \Delta Y_1$, $\Delta \alpha_{1-3} = \Delta Y_2$ and $\Delta \alpha_{2-3} = \Delta Y_3$, it can be determined that there is partial discharge near the crossing point O.

Figure 13:
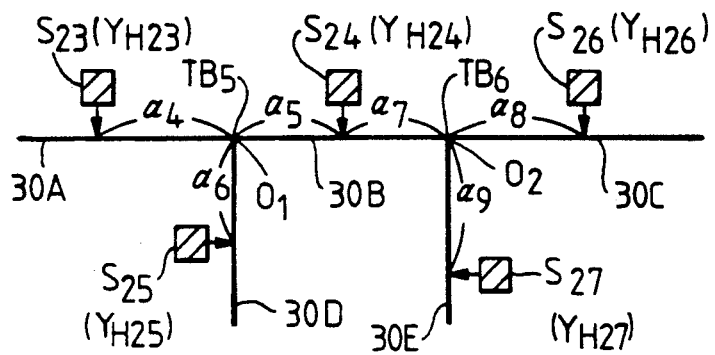
FIGS. 13 to FIG. 17 are respectively single line connection diagrams showing various bus arrangements including a branched part and the arrangement of detectors therein.

FIG. 13 shows an example in which a gas insulated electric apparatus constructed by connecting a T-shape branched bus shown in FIG. 12 is analyzed. In FIG. 13, the branched portion TB5 is constructed by bus tube 30A, 30B and 30D. Detectors $S_{23}$, $S_{24}$ and $S_{25}$ are provided for the respective bus tubes. The branched portion TB6 is constructed by bus tubes 30B, 30C and 30E. The bus tubes 30C and 30E have respective detectors $S_{26}$ and $S_{27}$.

In such construction, the respective amounts of propagation $\alpha_4$, $\alpha_5$ and $\alpha_6$ from the crossing point $O_1$ of the respective buses at the branched portion TB5 to the respective detectors $S_{23}$, $S_{24}$ and $S_{25}$ are obtained, and also the respective amounts of propagation $\alpha_7$, $\alpha_8$ and $\alpha_9$ from the crossing point $O_2$ of the respective buses at the branched portion TB6 to the respective detectors $S_{24}$, $S_{26}$ and $S_{27}$ are obtained. Then, for the bus portion of the branched portion TB5 and the bus portion of the branched portion TB6, by use of the detected levels $Y_{H23}$ to $Y_{H27}$, the detected level differences $\Delta Y_n$ and the propagation differences $\Delta \alpha_{n-m}$ between two detectors are compared, and a branched bus where the abnormal portion exists is oriented with the orientation method explained in FIG. 12. Then, two detectors the branched bus where a fault exists and selected, and the fault position between these detectors is located, used the method of FIG. 10.

Figure 14:
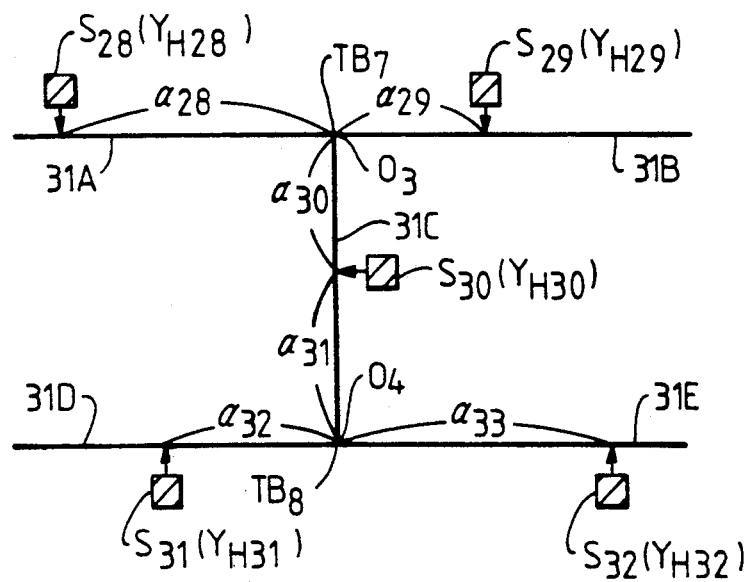

FIG. 14 shows an example in which the present invention is applied to a gas insulated electric apparatus of H shape construction formed by connecting a T shape branched bus as shown in FIG. 12. In FIG. 14, the branched portion TB7 has buses 31A, 31B and 31C. The buses 31A to 31C have respective detectors $S_{28}$, $S_{29}$ and $S_{30}$. The branched portion TB8 has buses 31C, 31D and 31E. The buses 31D and 31E have respective detectors $S_{31}$ and $S_{32}$.

In the gas insulated electric apparatus thus constructed, the respective amounts of propagation $\alpha_{28}$, $\alpha_{29}$, and $\alpha_{a30}$ from the crossing point $O_3$ of the respective buses at the branched portion TB7 to the detectors $S_{28}$, $S_{29}$ and $S_{30}$ and the respective propagation amounts $\alpha_{31}$, $\alpha_{32}$, and $\alpha_{33}$ from the crossing point $O_4$ of the respective buses at the branched portion TB8 to the detectors $S_{30}$, $S_{31}$ and $S_{32}$ are obtained. Then, for the branched portion TB7 and the branched portion TB6, by use of the detected levels $Y_{H28}$ to $Y_{H32}$ of the respective detectors, the detected level differences $\Delta Y_n$ and the propagation differences $\Delta \alpha_{n-m}$ between two detectors are compared and the branched bus in which there is a fault is located then by the method of FIG. 12.

Two detectors including the branched bus where there is a fault are selected, and the fault position between these detectors is located by the method of in FIG. 10.

Even when the detector $S_{30}$ in the bus 31C in FIG. 14 is eliminated, so that $\alpha_{28} - \alpha_{29} = Y_{H28} - Y_{H29}$ and $\alpha_{32} - \alpha_{33} = Y_{H31} - Y_{H32}$, a fault can be located within the bus 31C so that the fault position between these detectors can be determined by selecting the two detectors in the bus 31C and applying the method of FIG. 10.

In a construction without the detector $S_{30}$ in the bus 31C, when $\alpha_{28} - \alpha_{29} \neq Y_{H28} - Y_{H29}$ and $\alpha_{32} - \alpha_{33} = Y_{H31} - Y_{32}$, a fault can be located between the crossing point $O_3$ and the detectors $S_{28}$ or between the crossing point $O_3$ and the detector $S_{29}$ in the bus such that the detected level differences $\Delta Y_H$ and the amounts of propagation $\alpha$ are compared for the previous routes between the detector $S_{28}$ and the detector $S_{31}$, between the detector $S_{28}$ and the detector $S_{32}$ between the detector $S_{29}$ and the detector $S_{31}$ and between the detector $S_{29}$ and the detector $S_{32}$ to find out the route for which $\Delta Y_H \neq \Delta \alpha$ and thereafter the fault location within that route is determined using the method of FIG. 10.

When $\alpha_{32} - \alpha_{33} \neq Y_{H31} - Y_{H32}$ and $\alpha_{28} - \alpha_{29} = Y_{H28} - Y_{H29}$, a fault can be located in the bus between the crossing point $O_4$ and the detector $S_{31}$ or between the crossing point $O_4$ and the detector $S_{32}$ using the method described above.

Figure 15:
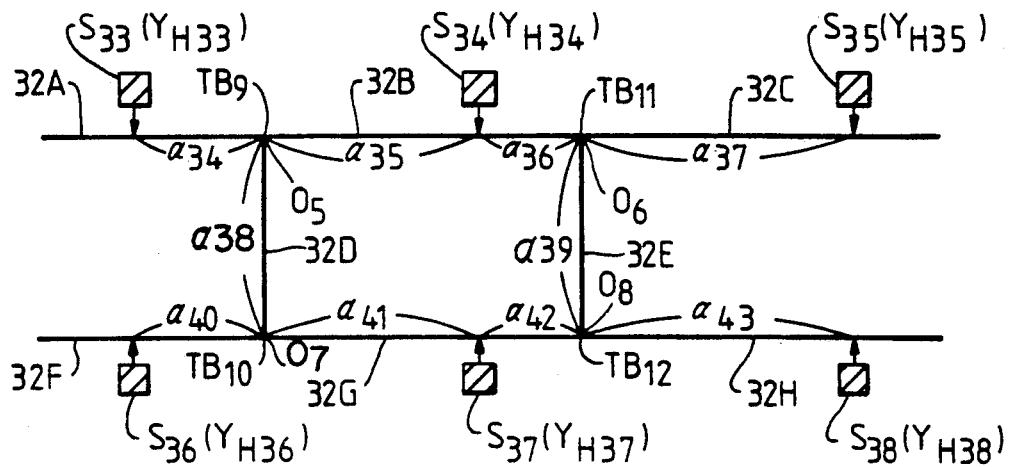

FIG. 15 shows an example of the present invention in which a gas insulated electric apparatus is formed by connecting two elements corresponding to the H type construction shown in FIG. 14. In FIG. 15, a component of an H construction has two branched portions $TB_9$ and $TB_{10}$ and buses 32A, 32B, 32D, 32F and 32G, and another component also has an H construction with two branched portion $TB_{11}$ and $TB_{12}$ and buses 32B, 32C, 32E, 32G and 32H, where two components are connected to form the gas insulated electric apparatus. Detectors $S_{33}$, $S_{34}$ and $S_{35}$ are respectively provided for the buses 32A, 32B and 32C connected to the branched portions $TB_9$ and $TB_{11}$. Detectors $S_{36}$, $S_{37}$ and $S_{38}$ are respectively provided. For the buses 32F, 32G and 32H connected to the branched portions $TB_{10}$ and $TB_{12}$.

In such a gas insulated electric apparatus, the propagation $\alpha_{34}$ and $\alpha_{35}$ from the crossing point $O_5$ of the respective buses at the branched portion $TB_9$ to the detectors $S_{33}$ and $S_{34}$, the propagation $\alpha_{40}$ and $\alpha_{41}$, from the crossing point $O_7$ of the respective buses at the branched portion $TB_{10}$ to the detectors $S_{36}$ and $S_237$, the propagation $\alpha_{36}$ and $\alpha_{37}$ from the respective buses at the branched portion $TB_{11}$ to the detectors $S_{34}$ and $S_{35}$, the propagation $\alpha_{42}$, and a $\alpha_{43}$ from the crossing point $O_8$ of the respective buses at the branched portion $TB_{12}$ to the detectors $S_{37}$ and $S_{38}$ the propagation $\alpha_{38}$ from the crossing point $O_5$ to the crossing point $O_7$, and the propagation $\alpha_{39}$ from the crossing point $O_6$ to the crossing point $O_8$ can be obtained. Thereafter, the analyses to locate a fault point is based upon the detected levels of the respective detectors $Y_{H33} - Y_{H38}$ and the above propagation using a method in which the of the detectors $S_{30}$ is omitted as explained in FIG. 14.

Such a fault location method will now be explained. First, to decide whether the location of a fault point is in the bus line 32A-32B-32C, the bus line 32F-32G-32H, the bus 32D or the bus 32E, the detected level difference $\Delta Y_{H33-34} = Y_{H33} - Y_{H34}$ of the detectors $S_{33}$ and $S_{34}$ is compared with the propagation difference $\Delta \alpha_{34-35} = \Delta_{34} - \alpha_{35}$ and the detected level difference $\Delta Y_{H34-35} = Y_{H34} - Y_{H35}$ of the detectors $S_{34}$ and $S_{35}$ is compared with the propagation difference $\Delta \alpha_{36-37} = \alpha_{36} - \alpha_{37}$, and when $\Delta Y_{H33-34} = \Delta \alpha_{34-35}$ and $\Delta Y_{H34-35} = \Delta \alpha_{36-37}$ it can be seen that there is no fault point on the bus line 32A-32B-32C. The detected level difference $\Delta Y_{H36-37} = Y_{H36} - YH_{37}$ between the detectors $S_{36}$ and $S_{37}$ is compared with the propagation difference $\Delta Y_{H37-38} = Y_{H37} - Y_{H38}$ of the the detected level difference $\Delta Y_{H37-38} = Y_{H37} - Y_{H38}$ of the detectors $S_{37}$ and $S_{38}$ is compared with the propagation difference $\Delta \alpha_{42-43} = \alpha_{42} - \alpha_{43}$; and when $\Delta Y_{H36-37} = \alpha_{40} - \alpha_{41}$ and $\Delta Y_{37-38} = \Delta \alpha_{42-43}$ it can be seen that there is no fault point on the bus line 32F-32G-32H. When the above two conditions are satisfied, there must then be a fault point on the bus line 32D or 32E. To decide whether the fault point is on the bus line 32D or the bus line 32E, the detected level difference $\Delta Y_{H33-36} = Y_{H33} - Y_{H36}$ between the detector $S_{33}$ (or the detector $S_{34}$) and the detector $S_{36}$ (or the detector $S_{37}$) is compared with the propagation difference $\Delta \alpha_{34-40} = \alpha_{34} - \alpha_{40}$, and also the detected level difference $\alpha Y_{H34-37} = Y_{H34} - Y_{H37}$ between the detector $S_{34}$ (or the detector $S_{35}$) and the detector $S_{37}$ (or the detector $S_{38}$) in the line including the bus 32E is compared with the propagation difference $\Delta \alpha_{36-42} = \alpha_{36} - \alpha_{42}$. When $\Delta Y_{H33-36} = \Delta \alpha_{34-40} + \Delta_{38}$ it is determined that there exists a fault point on the bus line 32D, and when $\Delta Y_{H34-37} \neq \Delta \alpha_{36-42} + \alpha_{39}$ is determined that there exists a fault point on the bus line 32E.

When fault points are located on the bus line 32A-32B-32C and the bus line 32F-32G-32H, this is a large difference between the detected level difference and the propagation difference between the detectors in the section where the fault point is located, so that the part in which the fault point is located is easily determined.

The precise position of the fault is determined by the location method discussed with reference to FIG. 10, with regard to the two detectors sandwiching the line or the section where the fault point is located.

In the example shown in FIG. 15, when an fault occurs in the circular route composed of the branched portions $TB_9$, $TB_{10}$, $TB_{12}$, $TB_{11}$ and the buses 32D, 32G and 32B, the power of electromagnetic wave at the fault point is divided into two and propagates in both directions as shown in FIG. 11. The propagated electromagnetic waves from opposite directions are superposed so that the power of the electromagnetic waves propagating within the circular route is doubled. Therefore, use can be made of the levels detected by the detectors $S_{34}$ and $S_{37}$ provided in the circular route and used for the orientation method explained in FIG. 10 so that the power at the fault point can be determined without adding the attenuated amount due to the division into halves at the fault point.

In such an embodiment the partial discharge generation position and the amount of power generated within the gas insulated electric apparatus formed by a complex circuit may be determined with an extremely high precision.

Next, an embodiment which may further enhance the precision of fault location will be explained. In a circuit construction corresponding to the gas insulated electric apparatus shown in FIG. 3, both ends of the main double buses BUST and BUS2 are sometimes left as an open ended terminal bus as shown in FIG. 2. As such, an open ended terminal bus, reflection is likely to occur due to impedance mismatching, and the propagation may change so that when fault location is performed based upon the detected level of the detector provided near the open terminal bus, it is preferable to make use of the change due to the reflection. Although the circuit breaker CB and the disconnecting switch DS, which form the circuit of the gas insulated electric apparatus, act to change over the power transmission circuit by opening the contacts for maintaining the apparatus, the electromagnetic wave, emitted by a partial discharge within the apparatus, easily propagates between the opened electrode gaps of such a circuit breaker CB and a disconnecting switch DS. Thus, there is the advantage that, when the detector provided in the apparatus is isolated from the power transmission circuit, the occurance of a fault in the power transmission circuit can be detected. It should be noted that the propagation may change at the open electrode gap, in a similar way to the open end terminal bus discussed above, due to impedance mismatching. Therefore, when the circuit breaker CB and the disconnecting switch DS within the circuit are in open condition, it is preferable to make use of the change in locating the fault.

With such a fault location method, the method of fault location should take into account the small change of propagation due to the opening and closing of the contacts in the disconnecting switch DS and the circuit breaker CB. In this way, the fault point can be located with better precision. Also, by storing in advance the above change for every part, in the propagation rate data base unit 23, and by providing a fault location device having means for detecting the opening and closing of the contacts in the respective circuit breaker CB and disconnecting switch DS, the efficiency of the fault location processing may be significantly improved.

Next, an embodiment which provides an effective arrangement of the detectors for simplifying the processing of the fault location operation will be explained.

Figure 16:
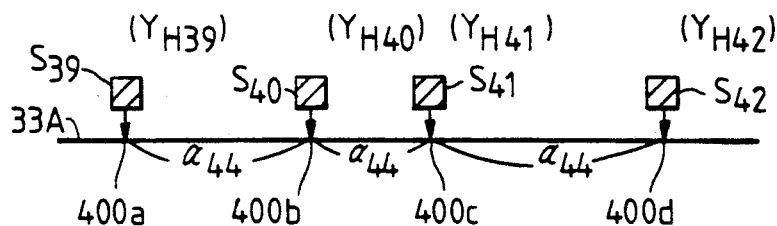

FIG. 16 shows an arrangement of detectors in a linearly arranged bus of a gas insulated electric apparatus. In FIG. 16, the detectors $S_{39}$, $S_{40}$ $S_{41}$ and $S_{42}$ provided in the bus 33A are located, at positions 400a, 400b, 400c and 400d respectively where the propagation $\Delta_{44}$ between the adjacent detectors are equal to each other.

In this embodiment, from the detected levels $Y_{H39}$ to $Y_{H42}$ of the respective detectors, the detector having the largest spectrum strength and the detector having the second largest spectrum strength are selected, and based upon these spectrum strengths a fault position between those two detectors is determined with the method explained with reference to FIG. 10.

With such an embodiment, the location of the fault point can be processed merely by comparison of the detected levels of the respective detectors so that the processing is greatly simplified. Also, since the fault location device includes a propagation rate database unit 23 for every part, which database stores the propagation $\Delta_{44}$ of a predetermined equal value, the fault location efficiency is significantly improved.

Figure 17:
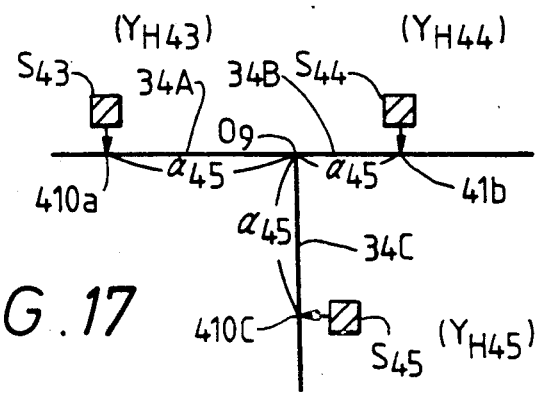

FIG. 17 shows an embodiment in which, in a branched bus as shown in the drawing, there are detectors $S_{43}$, $S_{44}$ and $S_{45}$ at the positions 410a, 410b and 410c where the propagation amounts $\alpha_{45}$ from the crossing point $O_9$ of the buses 34A, 34B and 34C are equal.

In this embodiment, by comparing the detected levels of the respective detectors, and by selecting the detector having the largest spectrum strength, the fault point can be located between the position of the above detector and the crossing point $O_9$ of the respective buses. For precise location of the fault point, the section of the branched bus between the detector having the largest spectrum strength and another detector in either of the buses is investigated, using the fault location method explained with reference to FIG. 10.

In such an embodiment, the fault location is immediately determined by comparing the detected levels of the respective detectors. There is then the advantage that the fault location is determined by a bus unit forming a branched portion.

Figure 18:
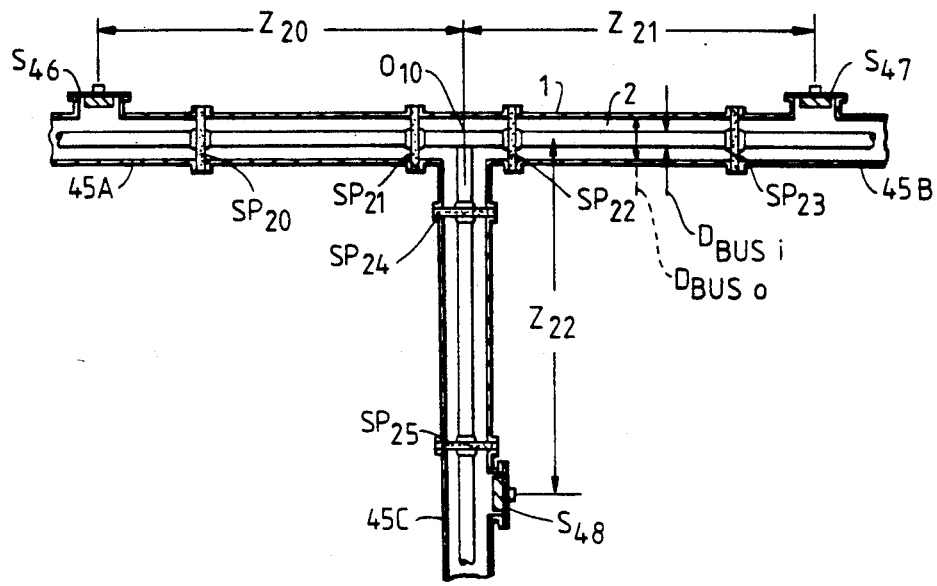
FIG. 18 is a cross-sectional view of a gas insulated electric apparatus using a fault location device according to a second embodiment of the present invention.

FIG. 18 shows another embodiment having an effective arrangement of detectors. In FIG. 18, the sizes of the inner diameters $D_{BUSi}$ of the metal container 1, and the outer diameters $D_{BUSo}$ of the high voltage conductor 2 in respective buses 45A, 45B and 45C are equal. Also, there are insulation supporting members $SP_{20}$ and $SP_{21}$, insulation supporting member $SP_{22}$ and $SP_{23}$ and insulation supporting members $SP_{24}$ and $SP_{25}$ at the same distance from crossing point $O_{10}$ of the respective buses, and detectors $S_{46}$, $S_{47}$ and $S_{48}$ for the respective buses are arranged at positions having the same distance $Z_{20}=Z_{21}=Z_{22}$ from the crossing point $O_{10}$.

In such an embodiment, the respective propagations from the crossing point $O_{10}$ to the respective detectors are the same, and their propagation curves show the same characteristics. Therefore, when a fault is located in a section between a detector having the largest spectrum strength and another detector at either of the other buses making use of the fault location method explained with reference FIG. 10, the fault position is determined from the propagation curves based upon the attenuation rate $\alpha_{BUS}$ due to the bus length. Thus, the position of the fault can be found by determining the propagation curves irrespective the attenuation rates $\alpha_{SP}$ of the insulation supporting members $SP_{20}$ to $SP_{25}$ and the attenuation rates $\alpha_{TB}$ of the branched portion points. The power generated at the fault point is obtained by adding to the spectrum strength of the fault point the attenuation amount between the fault point and the detector which has the largest spectrum strength. When the detected levels of the respective detectors are equal, it can be seen that the fault point is located near the crossing point $O_{10}$.

With such an embodiment, the fault location is performed using only the attenuation rate by the bus length. Hence, fault location processing is significantly simplified without reducing precision.

Next, a fault location method for a gas insulated electric apparatus having a three phase isolated bus and a three phase batched bus will be explained.

Figure 19:
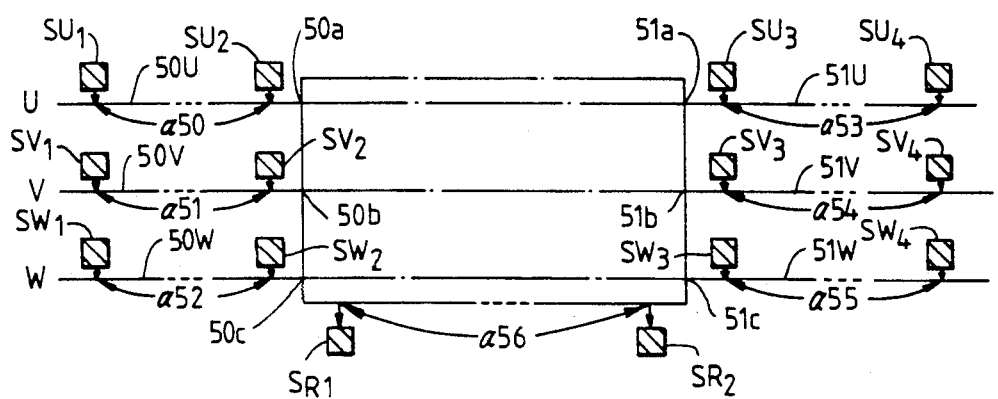
FIG. 19 is a single line connection diagram of a gas insulated electric apparatus using a fault location device according to a third embodiment of the present invention.

FIG. 19 shows an embodiment in which a gas insulated electric apparatus is formed by connecting phase isolated buses 50U, 50V and 50W to a three phase batched bus 50 and by connecting the other end of the three phase batched bus to phase isolated buses 51U, 51V and 51W. Detectors $SU_2$, $SV_2$ and $SW_2$ and a detector $SR_1$ are located in the respective phase isolated bus and the three phase batched bus near respective connecting portions 50a, 50b and 50c between the phase isolated buses 50U, 50V and 50W and the three phase batched bus 50. Similarly, detectors $SU_3$, $SV_3$ and $SW_3$ and a detector $SR_2$ are located in the respective phase isolated buses and the three phase batched bus near respective connecting portions 51a, 51b and 51c between the phase isolated buses 51U, 51V and 51W and the three phase batched bus 50. Also, detectors $SU_1$, $SV_1$ and $SW_1$ and detectors $SU_4$, $SV_4$ and $SW_4$ are located at positions spaced apart by a predetermined distance from the above respective detectors in the phase isolated buses.

First, the detected level difference of the two detectors in the respective phase isolated buses and the propagation between the two detectors and the detected level difference of the two detectors in the three phase batched bus and the propagation between the two detectors are compared. This permits determination of whether the fault point is within the phase isolated buses or the three phase batched bus. Respective detected level differences $\Delta Y_{U1-2}$, $\Delta Y_{V1-2}$ and $\Delta Y_{W1-2}$ between the detectors $SU_1$ and $SV_2$, the detectors $SV_1$ and $SV_2$ and the detectors $SW_1$ and $SW_2$ at the phase isolated buses 50U, 50V and 50W and their propagation amounts $\alpha_{50}$, $\alpha_{51}$ and $\alpha_{52}$ are compared. When $\Delta Y_{U1-2}=\alpha_{50}$, $\Delta Y_{V1-2}=\alpha_{51}$, $\Delta Y_{W1-2}=\alpha_{52}$, it can be seen that there is no fault point within the buses 50U, 50V and 50W. Similarly, respective detected level differences $\Delta Y_{U3-4}$, $\Delta Y_{V3-4}$ and $\Delta Y_{W3-4}$ between the detectors SU$_2$ and SU$_4$, the detectors SV$_3$ and SV$_4$ and the detectors SW$_3$ and SW$_4$ in the other phase isolated buses and their propagations $\alpha_{53}$, $\Delta_{44}$ and $\Delta_{55}$ are compared. When $\Delta Y_{U3-4} = \alpha_{53}$, $\Delta Y_{V3-4} = \alpha_{54}$ and $\Delta Y_{W3-4} = \alpha_{55}$, it can be seen that there is no fault point within the buses 51U, 51V and 51W.

Under the above conditions, when the relationship between the detected level difference $\Delta Y_{R1-2}$ between the detectors SR$_1$ and SR$_2$ in the three phase batched bus and the propagation $\alpha_{56}$ are in $\Delta Y_{R1-2} \neq \alpha_{56}$, it is can be seen that the fault point is located within the three phase batched bus. The location of the fault may then be determined, using the levels detected by the detectors SR$_1$, and SR$_2$ in the three phase batched bus and making use of the location method explained with reference to FIG. 10.

When it is detected that a fault point is within the three phase batched bus, the levels detected by the detectors SU$_2$, SV$_2$ and SW$_2$ disposed near the buses 50a, 50b and 50c and the levels detected by the detectors SU$_3$, SV$_3$ and SW$_3$ disposed at the connecting portions 51a, 51b and 51c are compared. The detector having the largest spectrum strength is determined, and it can then be seen that the fault point is located in the phase containing the detector having the largest spectrum strength and at a power source phase portion within the three phase batched bus of the same phase.

When the detected level difference $\Delta Y_{R1-2}$ of the detectors SR$_1$ and SR$_2$ within the three phase batched bus and its propagation $\alpha_{56}$ meet the condition $\Delta Y_{R1-2} = \alpha_{56}$, the levels detected by the group of detectors SU$_2$, SV$_2$ and SW$_2$ in the phase isolated buses 50U, 50V and 50W and the levels detected by the group of detectors SU$_3$, SV$_3$ and SW$_3$ in the buses 51U, 51V and 51W are compared. The power source phase having the largest detected level is determined, thereby to determined the power source phase in which the fault point is located. The position of the fault is determined using the levels detected by the two detectors in the power source phase in which the fault point is located and making use of the method explained with reference to FIG. 10.

In such an embodiment, it is possible to determined whether the abnormality generating position is within the phase isolated buses or the three phase batched bus, and determine which power source phase of the phase isolated buses or the three phase batched bus contains the fault. Thus, the location of the fault is determined precisely. Thus, the advantage of improved precision of fault location is achieved.

FIG. 20 is a three phase batched bus in which buses 52U, 52V and 52W are accommodated in a metal container 1d, and which has detectors SRU, SRV and SRW in the above three phase batched bus arranged to face the respective buses 52U, 52V and 52W.

In the embodiment of FIG. 20, signals from a partial discharge propagating within the three phase batched bus propagate with a comparatively high level using the power source phase as an antenna. The detector near the power source phase in which the fault point is located may exhibit the largest detected level. Therefore, by comparing the detected levels of these three detectors, the power source phase in which the fault point is located may be determined.

In the embodiment shown in FIG. 19, the frequency spectra of the partial discharge signals obtained from the respective detectors are represented by the pattern shown in FIG. 9. However, the pattern tends to differ depending upon whether the location of the fault point is within the phase isolated bus or the three phase batched bus. Thus, it is possible to determine whether the fault point is within the phase isolated bus or the three phase batched bus by use of the pattern difference in the frequency spectra and the position of the detectors. This gives higher precision.

Next, a fault location method using another factor as the spectrum strength will be discussed.

If a fault location device uses four parameter values $Y_{Hm}$, $Y_{HP.av}$, $W_{fH}$, $f_{H.W}$ obtained from the frequency spectrum shown in FIG. 21 as detected levels, the determination of the position of the fault can be based upon the respective parameter values obtained at the respective detectors and the attenuation of the respective parameters at the respective component, making use of the method explained with reference to FIG. 10.

Figure 21:
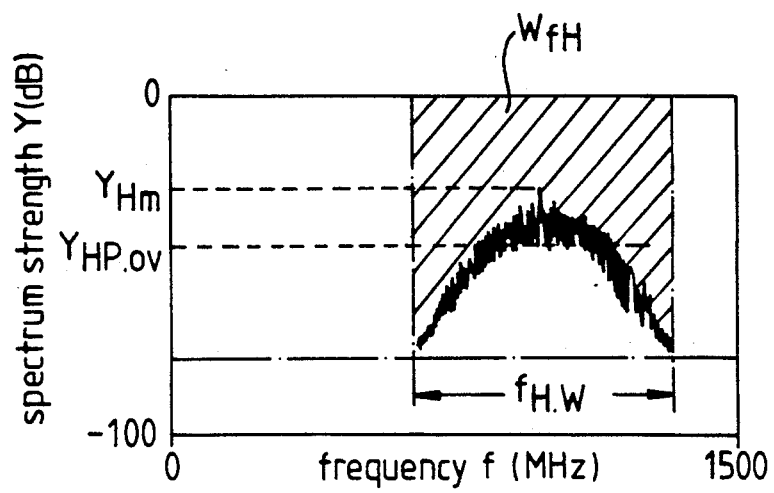
FIG. 21, FIG. 22(a), (b), (c) and FIG. 23 are respectively characteristics of parameters representing spectrum strengths.

All of the four parameters shown in FIG. 21 represent changes in the frequency spectrum and are factors for evaluating the propagation of the electromagnetic waves propagating within the apparatus. Thus, the frequency spectrum represents the amount of power of the propagating electromagnetic waves. The term $Y_{Hm}$ is the electric power of a specific frequency component exhibiting the largest spectrum value of several frequency components of the electromagnetic waves. The term $Y_{HP.av}$ represents the average electric power of a plurality of frequency components. The spectrum area $W_{fH}$ indicated by the hatched part of FIG. 21 is the total electric power of all frequency components forming the spectrum. Finally, the term $f_{H.W}$ represents a frequency band width of the electromagnetic waves.

Figure 22:
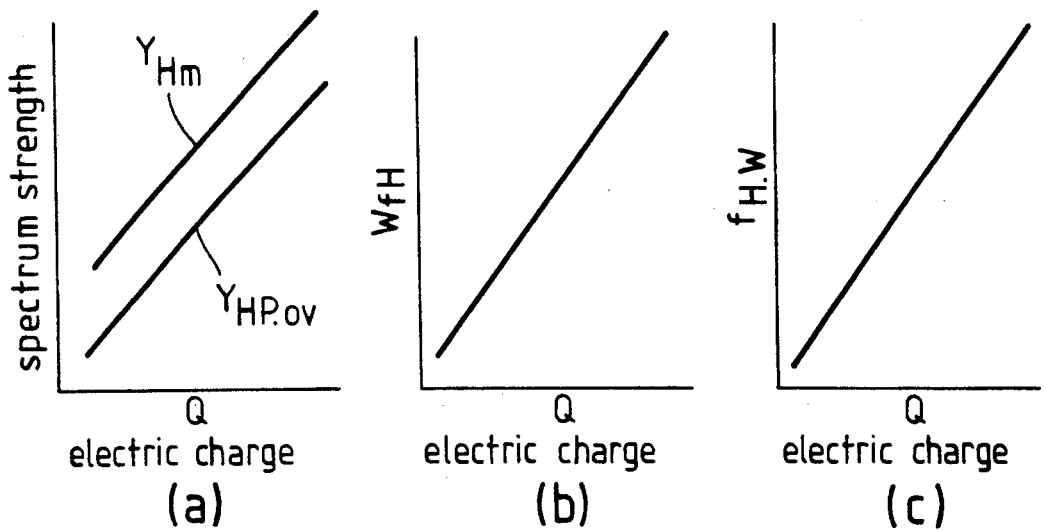
Figure 23:
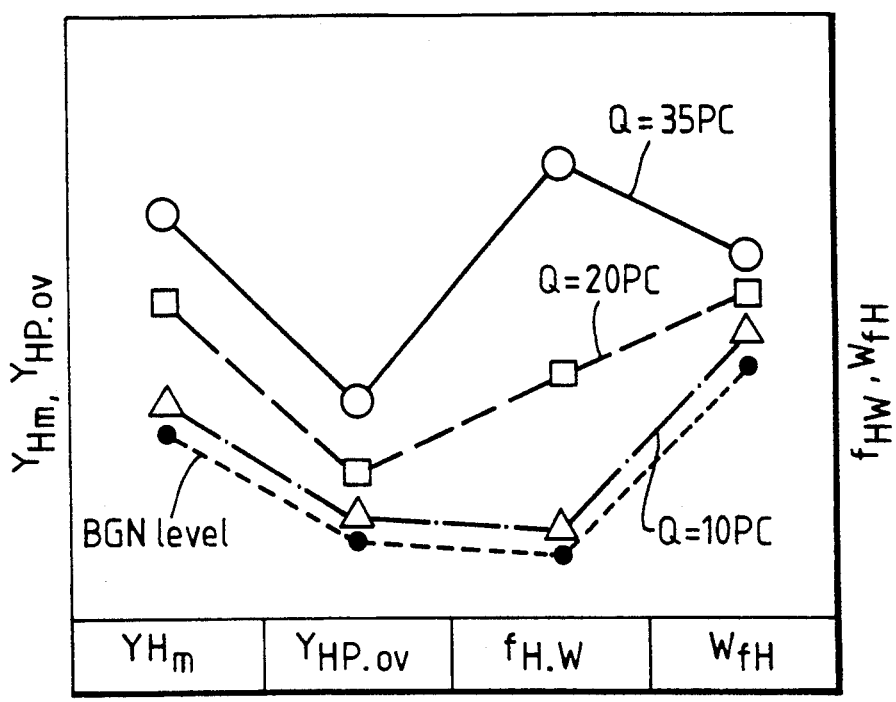
Figure 24:
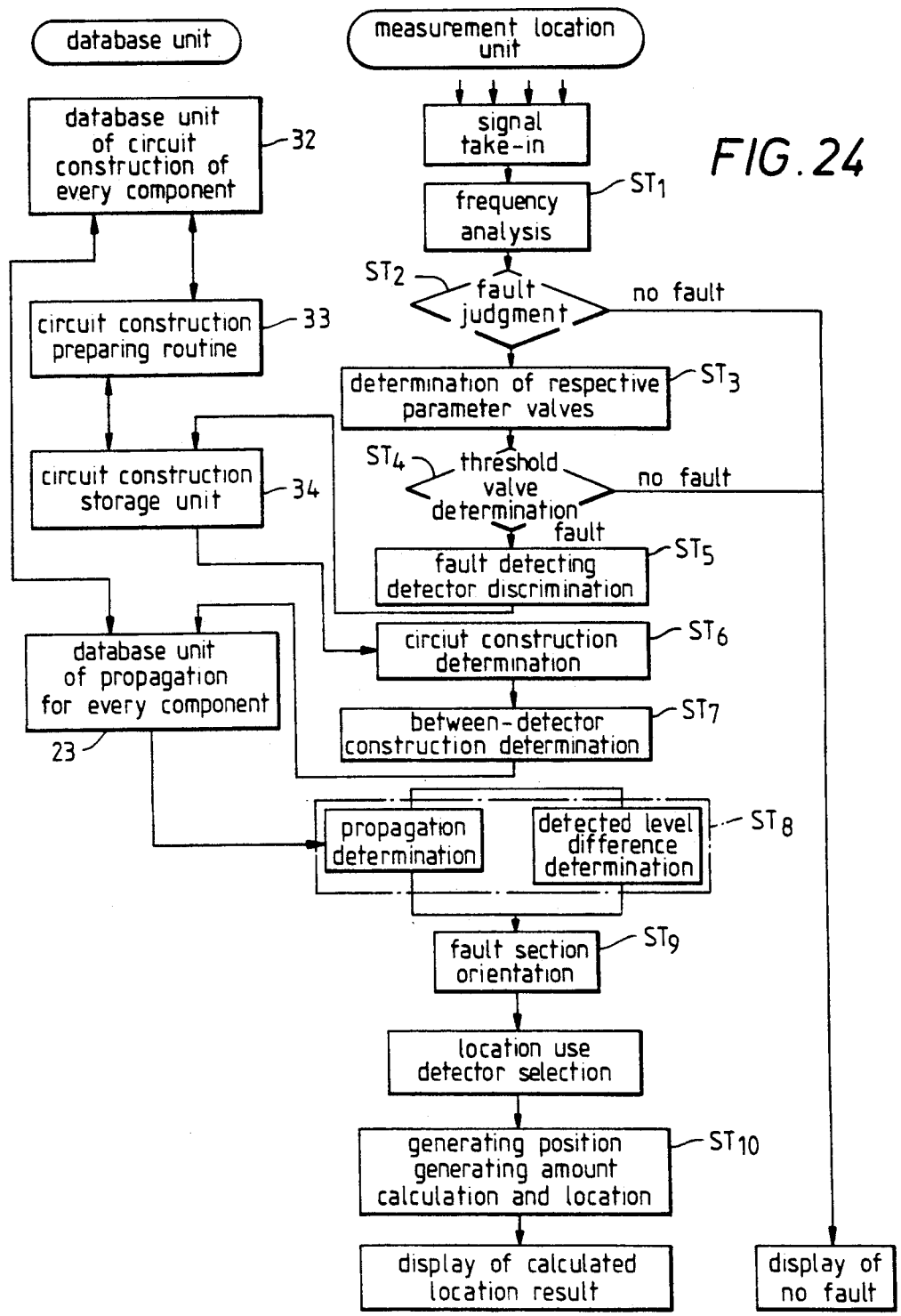
FIG. 24 is a flowchart showing the fault location method of the respective embodiments.

The above four parameters $Y_{Hm}$, $Y_{HP.av}$, $W_{fH}$ and $f_{H.W}$ have a correlation with the electric charge Q of the partial discharge as shown in FIG. 22(a), (b) and (c). Also, the respective parameters have characteristics exhibiting correlations with each other. For example, from the spectrum detecting fault signals of Q=10, Q=20, or Q=35 pc, the respective parameter values as shown in FIG. 23 are obtained. These levels change depending upon the positions of the detectors and the components of the apparatus. Hence, the fault position may be determined from the changes of the respective parameter values obtained at the plurality of detectors. FIG. 24 shows a flow chart of a fault location device forming the embodiment of the present invention, discussed above, which will be discussed further below.

The location device 20 has two routes, in that the device has a database unit and a measurement and location unit. First, data necessary are first inputted into the database unit. The database unit for the circuit construction stores data defining the construction for every component of the circuit, such as the items shown in FIG. 4. Thus, based upon the total circuit construction of the gas insulated electric apparatus, stored in the circuit constitution storage unit, such as the single line connection diagram as shown in FIG. 3 and the information of the above database unit of the circuit construction of every part and via the circuit construction preparation routine, the constitutions of every part in the entire circuit are identified and the result thereof is again stored in the circuit construction storage unit. The database unit 23 stores the propagation coefficients for every component corresponding to the construction of the apparatus and, the propagation rates for the respective components. Thus, the attenuation per unit length of the respective parts of the buses for the respective analysis parameters $Y_{Hm}$, $Y_{HP.av}$, $W_{fH}$ and $f_{HW}$, the attenuation at the insulation supporting members and the branched portions and the variation at the contact electrode open parts and the opened terminal portions of the disconnecting switch and the circuit break are stored. Also, the common propagation amount $\alpha_{44}$ between the respective detectors explained with reference to FIG. 16 and the common propagation amount $\alpha_{45}$ from the crossing point of the respective buses to the respective detectors indicated in FIG. 17 are stored in this database unit.

The preparation of the above database unit is performed as a preprocessing operation before entering the measurement and orientation unit. When the circuit construction of the gas insulated electric apparatus is different from that currently stored, the above operation is performed each time. As an alternative, several circuit constructions may be stored in the database unit, with the desired construction bus retrieved as appropriate.

Next, a flow chart of the measurement and location unit is explained.

The detected signal from the respective detectors have their frequency spectra analyzed at a step $ST_1$. At the next step $ST_2$, the existence or non existence of a fault is determined by pattern discrimination and spectrum subtraction means disclosed in Japanese Patent Application No. 63-103936 (1988) filed by the present applicant. When no fault is detected, an appropriate display is presented on the display unit 35. When it is detected that there is a fault at a step $ST_3$, the respective parameters $Y_{Hm}$, $Y_{hp.av}$, $f_{H.W}$ and $W_{fH}$ are determined from the frequency spectra of the detected signals. Then at a step $ST_4$, these parameters are compared with the threshold value of a predetermined hazardous level, and, when they are below the threshold value, the fault can be considered insignificant. On the other hand, when the parameters are more than the threshold value, the next step $ST_5$ that a detector is detecting a fault signal.

The next step $ST_6$ makes use of the information from the circuit construction storage unit 34 and the detector which detected the fault signal, to determine the relationship between the circuit construction in the region where the fault signal is detected and the construction of every component within the circuit. Also, it is decided whether the circuit in the fault region has phase isolated buses, three phased batched buses or a connecting bus between the phase isolated buses and the three phase batched bus. In the next step $ST_7$, the construction of every component between the detectors of which one detects the fault signals is determined. Then step $ST_8$ makes use of the information of the database unit of the propagation of every component to determine the propagation $\Delta$ as between the adjacent detectors and the detected level difference $\Delta Ys$. This operation involves consideration of whether the bus is arranged in a straight line, in a T shape, in, H shape, or in a circle. Furthermore, the propagation $\Delta\alpha_o - T$ from the crossing point of the respective buses to the respective detectors and the detected level difference $\Delta Y_{n-m}$ between the adjacent detectors are determined.

In the next step $ST_9 \Delta\alpha s$ and $\Delta Ys$ and further $\Delta\alpha_o - T$ and $\Delta Y_{n-m}$ are compared, and when $\Delta\alpha s = Ys$ and $\Delta\alpha_o - T = \Delta Y_{n-m}$, it can be seen that there is an fault between the two detectors for which the above condition holds. The connecting construction between the three phase batched bus and the phase isolated buses determines the component where the fault point is located in the above step using the orientation method explained with reference to FIG. 19. Two detectors are then selected which are on either side of the fault. The next step $ST_{10}$ makes use of the detected levels of the above two detectors to determine the location and strength of the fault, based on the method explained with reference to FIG. 10, and the result is displayed on the display unit 35 at a step $ST_{11}$.

Since this fault location detection 20 is in the form of a computer, the precision of processing may be improved and a shortening of the processing time may also be achieved. Furthermore, fault location via automatic monitoring may then be possible. By constructing the fault location device 20 so that it makes use of fuzzy logic and neurocomputer techniques, there are then the advantages that an improvement in the accuracy of the fault location, high processing efficiency and precision of life time prediction may be achieved.

Next, a method of displaying the fault position in the location device 20 according to the present invention will be explained.

The fault point located according to the above method is indicated with a mark in the circuit construction such as the circuit shown in FIG. 3 of the gas insulated electric apparatus, which are stored in the circuit construction storage unit, and the generating amount is displayed to complete the fault position display method.

According to this arrangement, the location of the fault position within the gas insulated electric apparatus is recognised to correspond to the operating power lines.

In an alternative display method indicating the abnormality generating position, the circuit region where the fault point is located may be enlarged and the fault point may be indicated by a mark in the circuit construction shown in FIG. 1.

According to the present embodiment, the components at and near the fault point are determined, and by discriminating whether the fault point is along the surface of the insulator, in its vicinity or in the gas filled space, the degree of danger of the fault may be predicted.

Figure 25:
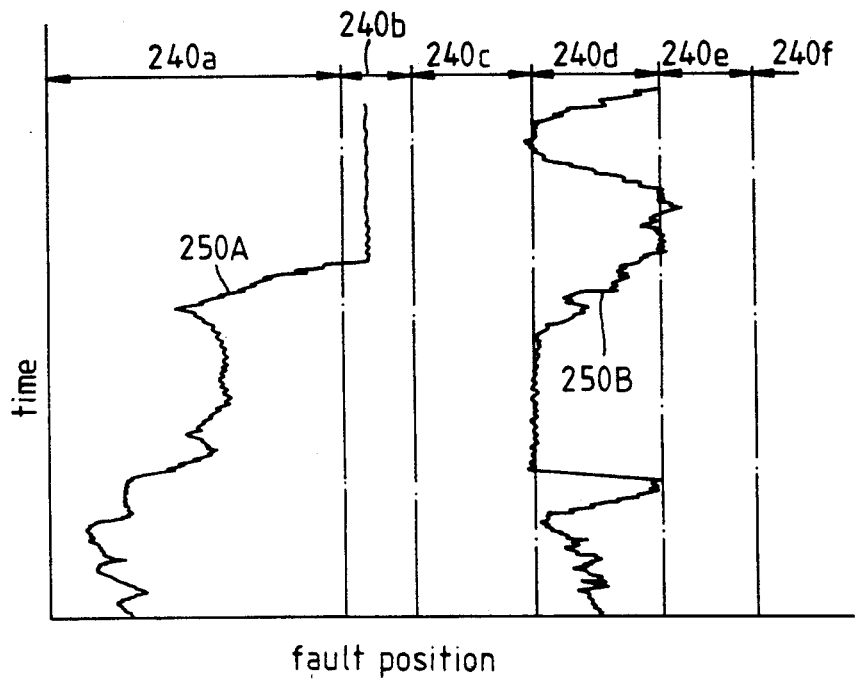
FIG. 25 and FIG. 26 are respective views showing display methods of the fault location results.

FIG. 25 shows a method displaying the time change of the fault location. The sources of the fault represented by loci 250A and 250B are mobile. The locus 250A indicates that the fault remains stationary after moving from the region 240a to the region 240b. The locus 250B shows the fault moves irregularly within the region 240d and shows no tendency to move out into other regions.

With such an arrangement, its possible to see whether the fault is stationary or mobile. Hence, the timing of maintenance and inspection can be predicted with a better precision.

Figure 26:
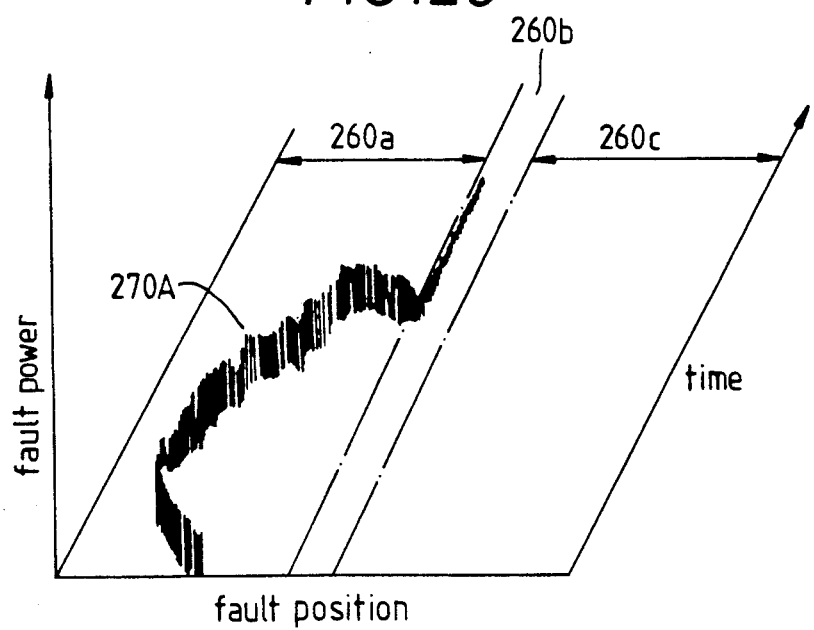

FIG. 26 is a three dimensional display in which the power of the fault is added to the fault position display described with reference to FIG. 25. FIG. 26, shows the cause of a mobile fault 270A corresponding to a partial discharge of a high level which first moves irregularly within the region 260a, and then the fault moves into the region 260b and remains in that region 260b with a partial discharge of a low level.

With such an arrangement the time change in the position of the fault together with the time change of the power is determined. Thus, the conditions of the fault and its position can be recognized in detail so that the timing of maintenance and inspection can be predicted with better precision.

Next, a gas insulated electrical apparatus in a transforming station will be considered, to show a method of obtaining the propagation (attenuation coefficient) of the respective components by using another fault location device.

Figure 27:
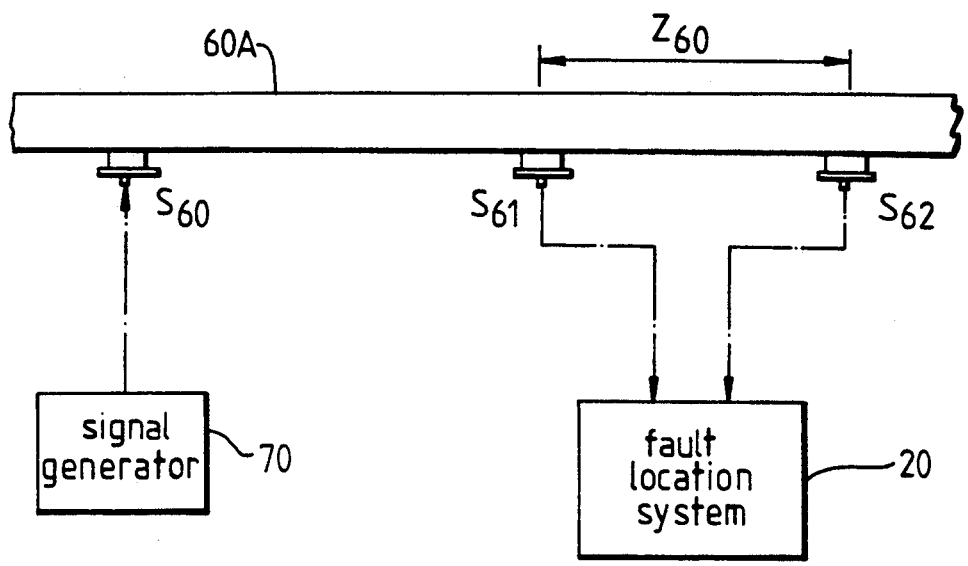
FIG. 27 and FIG. 28 are respectively diagrams of bus configurations showing measurements at an actual gas insulated electric apparatus in a transformer station and arrangement of detectors therein.

FIG. 27 shows a method in which high frequency signals from a signal generator 70 are injected into a detector $S_{60}$ in a bus 60A, and high frequency signals detected by other detectors $S_{61}$, $S_{62}$ are received by the fault location device. The signal generator 70 should have wide band frequency components up to the order of GHz, and also should have a stable output level. For instance, a tracking generator or a white noise generator can be employed, these being generally used in electronic technical field for examining the frequency characteristic of filters and amplifiers.

In such an embodiment, the high frequency signal transmitted from the detector $S_{60}$ propagates through the bus 60A and is received by the other detectors $S_{61}$, $S_{62}$. Thus, at the fault location device 20, the frequency spectra of the respective received signals are obtained as patterns similar to 200B shown in FIG. 9. Hence, the orientation parameter values such as $Y_{Hm}$, $Y_{HP.av}$, $f_{H.W}$, $W_{fH}$ may be obtained and making use of the received level difference between the detectors S60 and $S_{61}$ and the distance $Z_{60}$ between the detectors, the propagation rate a of the respective parameters in the bus 60A can be obtained.

Figure 28:
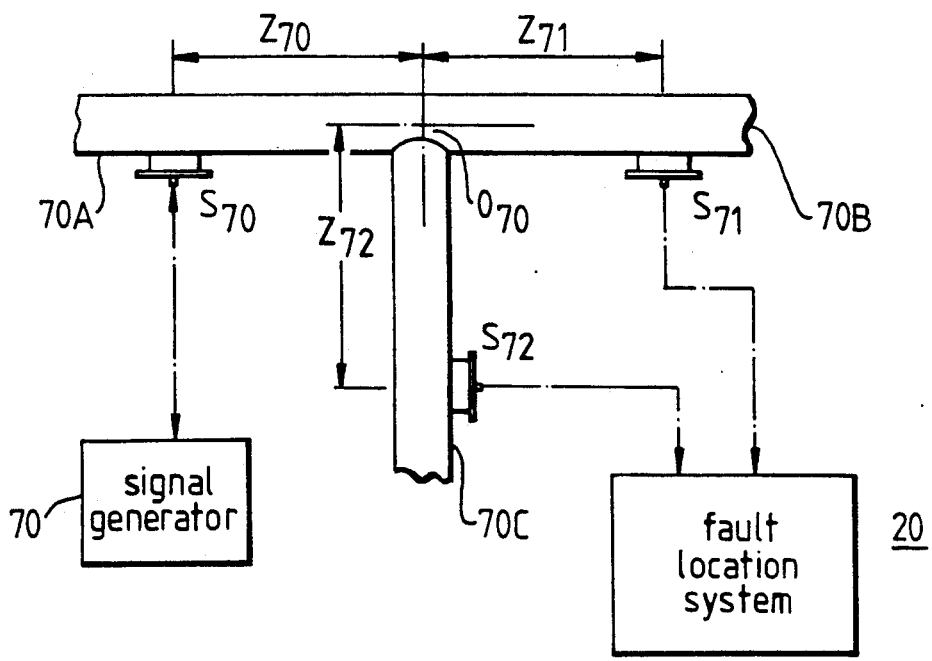

FIG. 28 shows an arrangement similar to FIG. 27, but with a branched bus. In the system of FIG. 28, there are detectors $S_{70}$, $S_{71}$, $S_{72}$ at positions having distances $Z_{70}$, $Z_{71}$, $Z_{72}$ from the crossing point $O_{70}$ of the buses 70A, 70B and 70C. High frequency signals from the signal generator 70 are injected into a detector $S_{70}$, and the signals received at the other detectors $S_{71}$, $S_{72}$ are received by the fault location device 20.

In this arrangement, the detected levels (for instance $Y_{H71}$, $Y_{H72}$ of the detectors $S_{71}$, $S_{72}$), the propagation $\alpha_{71}$ between the crossing point $O_{70}$ and the detector $S_{71}$ and the propagation (attenuation coefficient) $\alpha_{72}$ between the crossing point $O_{70}$ and the detector $S_{72}$, satisfy the following equation for the detected level difference $\Delta Y_1 = Y_{H71} - Y_{H72}$ and the above propagation.

$$\Delta Y_1 = \alpha_{71} - \alpha_{72} \quad (7)$$

Similarly, using the detected level difference $\Delta Y_2$ between the detectors $S_{70}$ and $S_{72}$ and respective propagation (attenuation coefficient) $\alpha_{70}$ and $\alpha_{72}$ between the crossing point $O_{70}$, and the detector $S_{70}$ and between the crossing point $O_{70}$ and the detector $S_{72}$, when the detector $S_{71}$ is selected as the signal injection point, the relationship indicated in equation (8) is obtained.

$$\Delta Y_2 = \alpha_{70} - \alpha_{72} \quad (8)$$

Similarly, when the detector $S_{72}$ is selected as the injection point, the detected level difference $\Delta Y_3$ between the detector $S_{70}$ and the detector $S_{71}$ and propagation (attenuation coefficient) $\alpha_{70}$ and $\alpha_{71}$ from the crossing point $O_{70}$ to the detector $S_{70}$ and the detector $S_{71}$ can be used to obtain the following relationship.

$$\Delta Y_3 = \alpha_{70} - \alpha_{71} \quad (9)$$

From equations (7), (8) and (9) the propagations $\alpha_{70}$, $\alpha_{71}$ and $\alpha_{72}$ from the crossing point $O_{70}$ to the respective detectors can be obtained.

Hence, the propagations from an actual machine to respective components can be determined precisely. The measured propagation obtained according to the present embodiment may be stored in the database unit as propagation values for every component. Also when such a system uses an automatic measurement routine to perform the above measurement and the propagations between the respective detectors are automatically measured while automatically and successively switching the detectors to which the high frequency signals are injected, the respective propagations can be determined quickly and precisely. In addition, the propagations of every component, which are stored in advance, are compared with the measured propagations and corrected to obtain optimum values so that, based upon the optimum values, the component which contains the fault and the location of the fault within that component can be determined with an extremely good precision.

The actual measurement method using the simulated signals is applicable for inspecting the soundness of the respective detector, and, in addition, by relating the output level of the signal generator to a level of electric discharge, the detected levels of the respective detectors in their respective positions in the apparatus can be calibrated.

Next, an embodiment relating to the arrangement of detectors for monitoring and detecting -partial discharge generating within the gas insulated electric apparatus circuit shown in FIG. 3 and for locating the fault positions will be explained.

Figure 29:
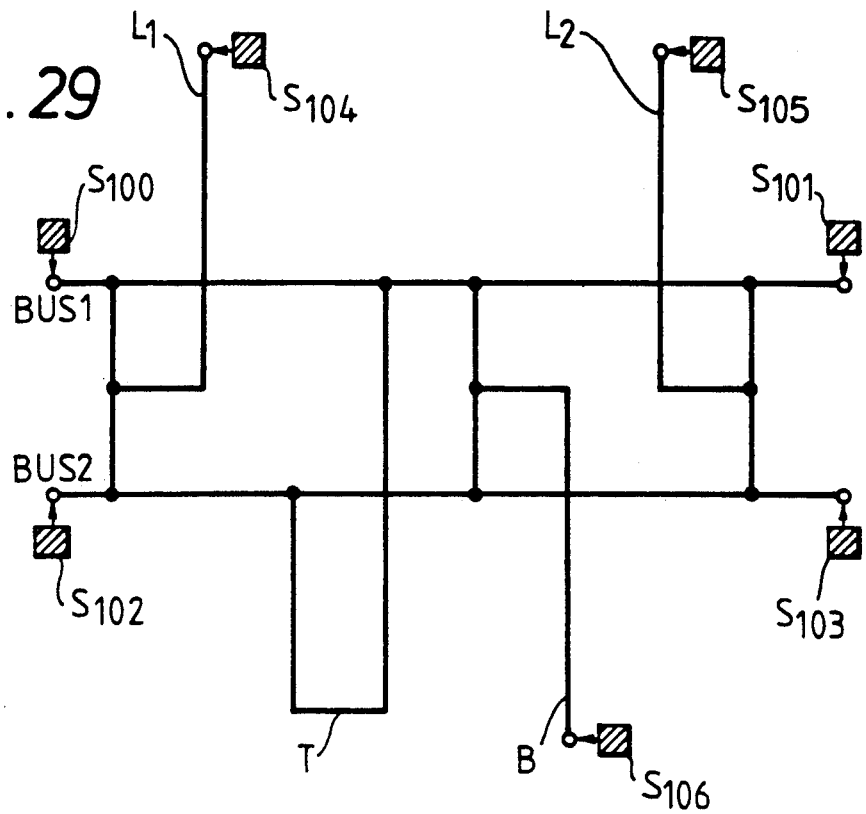
FIG. 29, FIG. 30.
Figure 30:
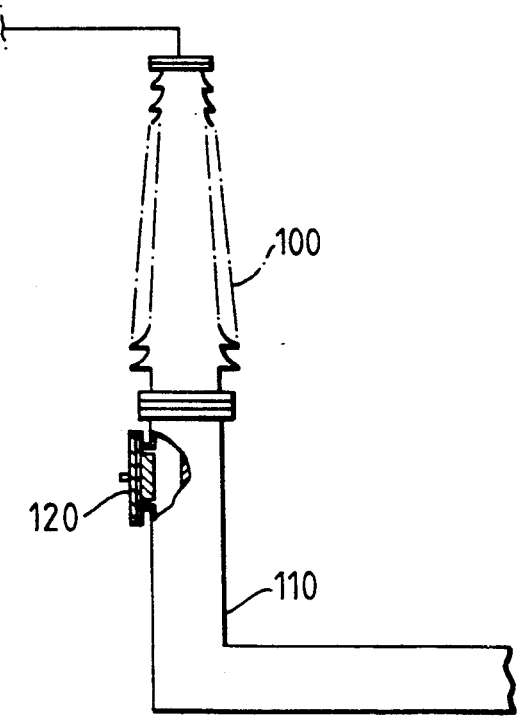

In FIG. 29, a detector $S_{100}$, a detector $S_{101}$, a detector $S_{102}$ and a detector $S_{103}$ are arranged at respective bus ends of main double buses BUS1 and BUS2. Similarly, there are detectors $S_{104}$ and $S_{105}$ at the bus end portions of the line units $L_1$, $L_2$ and a detector $S_{106}$ at the bus end portion of the bank unit B. The detectors $S_{100}$, $S_{101}$, $S_{102}$, $S_{103}$ at the end portions of the main double buses have the construction shown in FIG. 2, and the detectors $S_{104}$, $S_{105}$ at the end portion of the line unit are provided at a position 120 near the juncture between a power receiving and supplying bushing 100 and a line unit bus 110 as shown in FIG. 30. Although not illustrated specifically, the detector $S_{106}$ provided at the bank unit is provided at a position near the junction with a transformer.

The construction above minimizes the number of the detectors to be provided as explained above, but permits partial discharges generated within the circuit to be detected by the detectors at the ends of the respective lines. To locate the fault, the detected level difference $\Delta Y$ between two detectors and a propagation amount $\alpha$ between the detectors detecting fault signals are compared. Then it can be detected that a fault point is located in the route where $\Delta Y \neq \alpha$. Thus, the determination of a fault in the main bus BUS1 line is carried out by comparing the detected level difference between a detector $S_{100}$ and a detector $S_{101}$ with the propagation values and, similarly, the determination of the fault in the main bus BUS2 line is carried out by comparing the detected level difference between a detector $S_{102}$ and a detector $S_{103}$, Further, in the determination of the fault in line units $L_1$, the detectors $S_{104}$ and $S_{100}$, or the detectors $S_{104}$ and $S_{102}$ are used, and in the determination of the fault in line units $L_2$, the detectors $S_{105}$ and $S_{101}$, or the detectors $S_{105}$ and $S_{103}$, are used. In the bank unit B, the detector $S_{106}$ and the detectors $S_{100}$, $S_{101}$, $S_{102}$ and $S_{103}$ are used. In the tie unit T, the detector $S_{100}$ including the tie unit and the detector $S_{103}$ and the detector $S_{102}$ and the detector $S_{101}$ are used. Taking onto account the section between two detectors where $\Delta Y = \neq \alpha$ holds. The fault position is located by the method explained with reference to FIG. 10.

Figure 31:
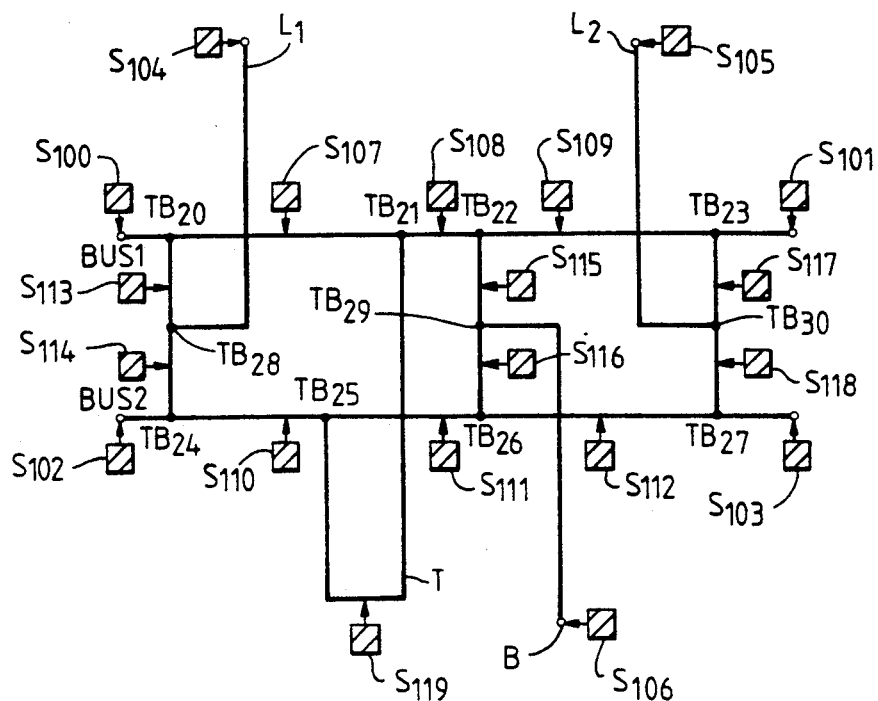
FIG. 31, FIG. 32, FIG. 33 and FIG. 34 are respectively views showing examples of detector arrangements for the components of respective electric power apparatuses.

FIG. 31 shows another embodiment in which there are detectors $S_{107}$ to $S_{118}$ at respective buses forming branched portions $TB_{20}$ to $TB_{30}$, in addition to the detectors $S_{100}$ to $S_{106}$ at the respective ends as explained in connection with FIG. 29.

With the arrangement of FIG. 31, by analysing the detectors forming the respective branched portions from the groups of detectors detecting fault signals, the location of a fault in the respective branched portions can be determined with good precision by using the method explained with reference to FIG. 12. The fault location processing is greatly simplified.

Figure 32:
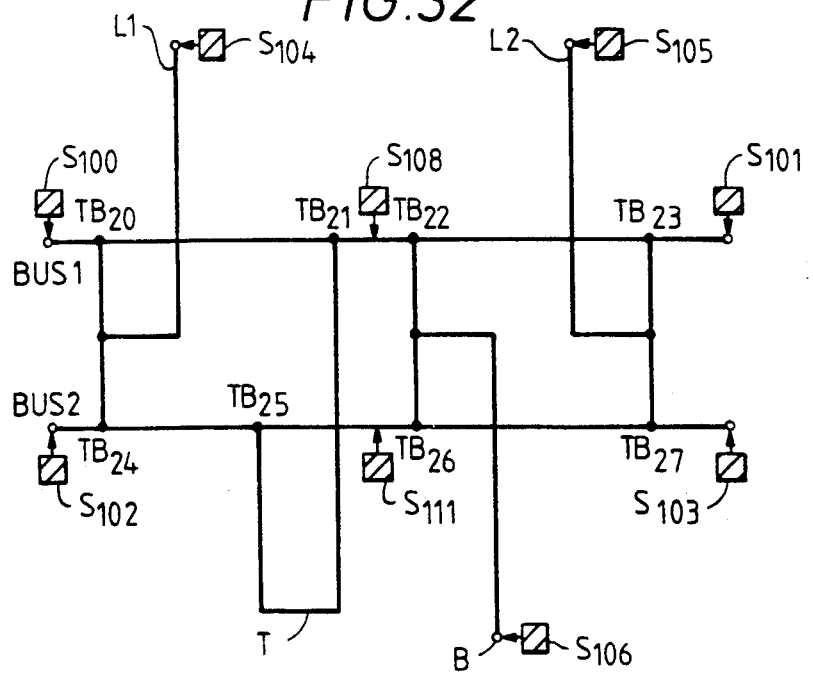

FIG. 32 shows another embodiment in which a detector $S_{108}$ and a detector $S_{111}$ are added to the construction shown in FIG. 29 at the main bus BUS1 and BUS2 lines. This construction has a block with detectors $S_{100}$, $S_{108}$, $S_{111}$, $S_{102}$ at the four branched portions $TB_{20}$, $TB_{21}$, $TB_{25}$, $TB_{24}$, and another block with detectors $S_{108}$, $S_{101}$, $S_{103}$, $S_{111}$ at the four branched terminals of a circular bus formed by four branched portions $TB_{22}$, $TB_{23}$, $TB_{27}$, $TB_{26}$.

In the above construction, a component containing a fault may determined by the detectors provided at the respective four terminals of the circular bus forming respective blocks. Thus, for a fault in the block formed by the branched portions $TB_{20}$, $TB_{21}$, $TB_{25}$, $TB_{24}$, the detector $S_{100}$ and the detector $S_{108}$ detect a fault in the line connecting the branched portion $TB_{20}$ and the branched portion $TB_{21}$. Similarly, the detector $S_{100}$ and the detector $S_{102}$ detect a fault in the line connecting the branched portion $TB_{20}$ and the branched portion $TB_{24}$. The detector $S_{102}$ and the detector $S_{111}$, detect a fault in the line connecting the branched portion $TB_{24}$ and the branched portion $TB_{25}$. The detectors $S_{108}$ and the detector $S_{111}$, detect a fault in the line connecting the branched portion $TB_{21}$ and the branched portion $TB_{25}$. Using the detected level difference $\Delta Y$ between the respective detectors and the propagation values (attenuation coefficients), the component containing a fault may thus be determined. When there is a fault in a selected first one of the blocks, the subsequent block is investigated in a similar manner as above, and the component in which there is a fault point is thus determined, using the orientation method explained with reference to FIG. 10.

With the above construction, the advantage is obtained that the number of detectors can be greatly reduced without making the fault location processing more complex and without lowering the precision of fault location.

Figure 33:
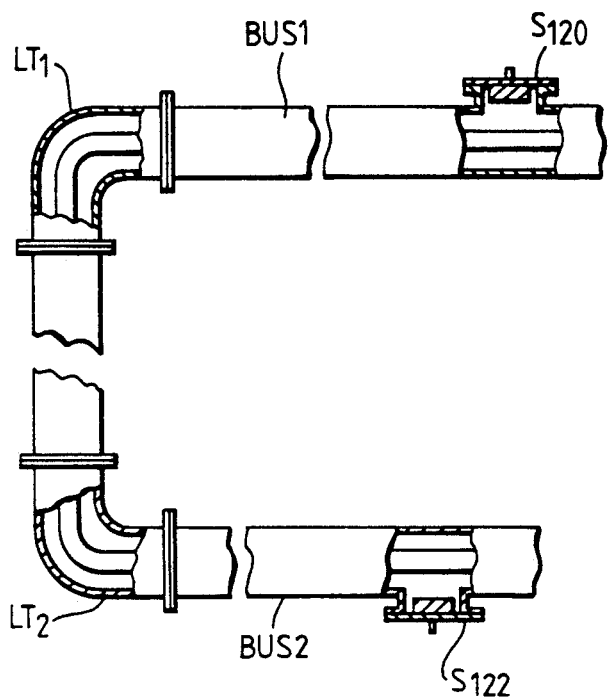
Figure 34:
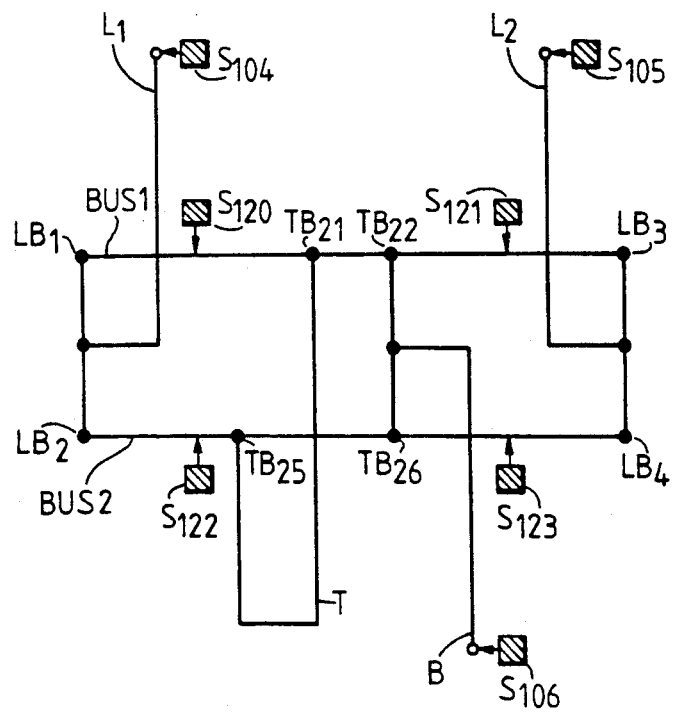

FIG. 33, shows an L type construction which contains no branched portion at the terminals of the main buses BUS1 and BUS2. The location of the detectors is not limited to the terminal portions, and it is possible for the detectors to be located at points other than the terminal portions such as those shown in FIG. 34 in which both ends of the main buses BUS1, BUS2 are formed respectively by L type components $LB_1$ and $LB_3$, and L type components $LB_2$ and $LB_4$. Detectors $S_{120}$, $S_{121}$, $S_{122}$ and $S_{123}$ monitor both main buses, and are located at any position on the main buses BUS1 and BUS2. Fault location is carried out on the line $S_{120}$-$LB_1$-$LB_2$-$S_{122}$, the line $S_{120}$-$TB_{21}$-$TB_{25}$-$S_{122}$, the line $S_{120}$-$TB_{21}$-$TB_{22}$-$S_{121}$, the line $S_{121}$-$LB_3$-$LB_4$-$S_{123}$, the line $S_{121}$-$TB_{22}$-$TB_{26}$-$S_{123}$, and the line $S_{122}$-$TB_{25}$-$TB_{26}$-$S_{123}$ by comparing the detected level difference $\Delta Y$ and the propagations $\alpha$, and after determining the line containing a fault, the position of the fault is determined using the method explained with reference to FIG. 10.

With the above construction, in which detectors are at any position on the main bus lines, other than end portions, the advantage is obtained that a fault within the entire circuit can be monitored and detected and its location can readily be determined.

Next, a further display method for displaying the result of the fault location method will be explained.

In FIG. 35, the locations of a partial discharge are roughly classified into insulator portions with a very high degree of danger and gas filled space portions with a comparatively low degree of danger, and an appropriate treatment method is also displayed. When there is a high possibility that a partial discharge is generated at the insulator portion, the display shows urgent treatment is necessary and a suitable countermeasure may be required (treatment (1)). When a partial discharge occurs in the gas filled space portion, urgent treatment is not necessary and the display shows that, depending upon the position of the fault, determination of maintenance and inspection timing is necessary (treatment (2)). This may be displayed together with a mark displaying the location of the fault within the entire circuit shown in FIG. 3.

FIG. 36, shows a display in which treatment is displayed, in a manner which relates the treatment to the degree of danger, the time change in the fault position and the power of the fault. Thus, for example, when the fault is in an insulator and its position is stationary, the degree of danger is high so that the appropriate treatment is to isolate immediately the component containing the fault from the operating circuit, or to carry out immediate maintenance and inspection (treatment (1)-1). When the fault is in an insulator but its position is mobile, monitoring of its movement is continued, and the display shows that it is necessary to prepare for performing suitable treatment similar to the above described (treatment (1)-1) immediately after the discharge becomes stationary at the insulator portion and to carrying out early maintenance and inspection (treatment (1)-2). When the position of the partial discharge is in the gas filled space, and is stationary, the period remaining to the subsequent maintenance and inspection is related to the weight of the predetermined degree of danger of the respective portions is displayed, followed by the corresponding rank (treatment(2)-1). When the position of the partial discharge is in the gas filled space and is a mobile one, monitoring of its movement is continued, and the rank of the degree of danger in its moving region and the remaining period range (treatment (2)-2) to the subsequent maintenance and inspection in its rank range are displayed.

In FIG. 37, the positions of the partial discharge are subdivided, and an example is shown in which a treatment method corresponding to the respective fault location is displayed. Thus, the treatment displayed is subdivided into treatment (1)-1-1 when there is a stationary fault on the surface of the insulator, treatment (1)-1-2 when there is a stationary fault inside the insulator, treatment (2)-1-1 when there is a stationary fault in the high voltage conductor portion of the gas filled space, treatment (2)-1-2 when there is a stationary fault in the high voltage shield portion of the gas filled space, treatment (2)-1-3 when there is a stationary fault in the contact portion of the gas filled space, treatment (1)-2-1 when there is a moving fault on the surface of the insulator, treatment (1)-2-2 when there is a moving fault inside the insulator, treatment (2)-2-1 when there is a moving fault in the high voltage conductor portion of the gas filled space, treatment (2)-2-2 when there is a moving fault in the high voltage shield portion of the gas filled space, and treatment (2)-2-3 when there is a moving fault in the contact portion of the gas filled space. In each case, the treatment will be related to the degree of danger involved in each fault location.

The treatment specifications shown in FIG. 35 to FIG. 37 are prestored in the database unit and the appropriate treatment specification is retrieved in response to the result and displayed together with the fault position.

Figure 38:
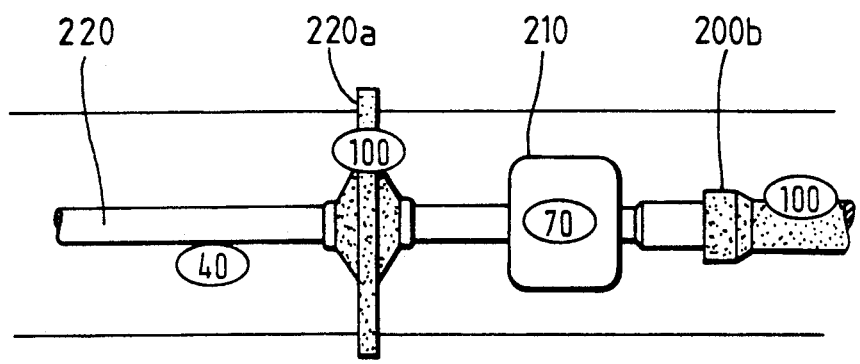
FIG. 38 is a diagram of part of network of a power apparatus.

FIG. 38 shows another display method, in which the degree of danger of the respective components can be displayed so that the insulators 200a and 200b having the highest degree of danger are alloted a weight of 100, the high voltage shield portion 210 having second highest degree of danger is alotted a weight of 70 and the high voltage conductor portion 220 having a relatively low degree of danger is allotted a weight of 40.

According to this arrangement, the degree of danger corresponding to the fault point is immediately determined from the display screen and the timing of maintenance and inspection to correspond with the weight of the degree of danger is then possible.

In an electric power apparatus according to the present invention, as explained above, by using detectors detecting electromagnetic wave due to partial discharge and by taking into account differences in the electromagnetic wave propagations (attenuation coefficients) for respective components, the position having the maximum spectrum strength may be determined, corresponding to the position of partial discharge generation, so that fault location with a high sensitivity and good precision may be carried out. As the result, the maintenance and reliability of the electric power apparatus may be enhanced.

Further, according to the fault location method of the present invention, the processing may be carried out in a short time and with good precision.

What is claimed is:

1. A power apparatus comprising:
   a plurality of high voltage conductors supported by insulating supporting members within metal containers;
   a plurality of spaced apart detectors disposed in the metal containers, each of said detectors being arranged to detect electromagnetic waves generated by a fault of electric insulation belonging to at least one of said high voltage conductors between any pair of said detectors, and to generate corresponding outputs; and
   analyzing means for analyzing the location of said fault on the basis of attenuation coefficients of the electromagnetic coefficients of the electromagnetic waves propagated between said any pair of said detectors and said outputs of said detectors.

2. An apparatus according to claim 1, wherein said analysing means further includes means for storing attenuation coefficients of each of said identifiable components.

3. An apparatus according to claim 1, wherein said analysing means further includes means for storing a map corresponding to said identifiable components of said network.

4. An apparatus according to claim 1 wherein said analysis means further includes means for displaying the location of said fault in terms of the time variation thereof.

5. An apparatus according to claim 1, wherein said analysing means includes means for storing a plurality of predetermined electromagnetic wave strengths between each of said detectors, and means for comparing the strength of the electromagnetic waves detected by said detectors with a corresponding one of said predetermined electromagnetic wave strengths, so as to detect any difference between the strength of each electromagnetic wave detected and the corresponding one of said predetermined electromagnetic wave strengths for any pair of said detectors.

6. An apparatus according to claim 1, wherein said network comprises a hollow casing supporting a high voltage conductor, and said components are components of said casing.

7. An apparatus according to claim 6, wherein said casing contains an insulating gas.

8. An apparatus according to claim 6, wherein said components include one or more of : linear parts of said casing, insulation spacers, T-junctions, disconnecting switches and circuit breakers.

9. An apparatus according to claim 1, wherein said means for determining the location of said fault is arranged to calculate propagation curves of said electromagnetic waves for each of said any pair of said detectors on the basis of said attenuation coefficients, and is arranged to calculate the intersection point of propagation curves, thereby to determine the location of said fault.

10. An apparatus according to claim 1, further including an alarm for indicating the detection of said fault.

11. A power apparatus comprising:
    a plurality of high voltage conductors supported by insulating support members within metal containers;
    a plurality of spaced apart detectors disposed in the metal containers, each of said detectors being arranged to detect electromagnetic waves generated by a fault of electric insulating belonging to at least one of said high voltage conductors between any pair of said detectors, and to generate corresponding outputs; and
    analyzing means for storing attenuation coefficients of the electromagnetic coefficients of the electromagnetic waves propagated between said any pair of said detectors, and determining the location of said fault on the basis of said attenuation coefficients and said outputs of said detectors.

12. An apparatus according to claim 11, wherein said network comprises a hollow casing supporting a high voltage conductor, and said components are components of said casing.

13. A power apparatus comprising:
    a plurality of high voltage conductors supported by insulating supporting members within metal containers;
    a plurality of spaced apart detectors disposed in the metal containers, each of said detectors being arranged to detect electromagnetic waves at least at two detection sites generated by a fault of electric insulation belonging to at least one of said high voltage conductors between any pair of said detectors, and to generate corresponding outputs; and analyzing means for storing a map corresponding to attenuation coefficients of the electromagnetic waves propagated between said detection sites, and determining said fault position on the basis of said attenuation coefficients and said signals.

14. An apparatus according to claim 13, wherein said network comprises a hollow casing supporting a high voltage conductor, and said components are components of said casing.

15. A power apparatus comprising:
a plurality of high voltage conductors supported by insulating supporting members within metal containers;
a plurality of spaced apart detectors disposed in the metal containers, each of said detectors being arranged to detect electromagnetic waves generated by a fault of electric insulating belonging to at least one of said high voltage conductors between any pair of said detectors, and to generate corresponding outputs; and
analyzing means for analyzing the location of said fault on the basis of attenuation coefficients of the electromagnetic coefficients of the electromagnetic waves propagated between said any pair of said detectors and said outputs of said detectors, and for displaying the location of said fault in terms of the time variation thereof.

16. An apparatus according to claim 15, wherein said network comprises a hollow casing supporting a high voltage conductor, and said components are components of said casing.

17. A power apparatus comprising:
a plurality of high voltage conductors supported by insulating supporting members within metal containers;
a plurality of spaced apart detectors disposed in the metal containers, each of said detectors being arranged to detect electromagnetic waves generated by a fault of electric insulating belonging to at least one of said high voltage conductors between any pair of said detectors, and to generate corresponding outputs; and
analyzing means for storing a plurality of predetermined electromagnetic wave strengths between each of said detectors, comparing the strength of the electromagnetic waves detected by said detectors with a corresponding one of said predetermined electromagnetic wave strengths, and detecting fault position on the basis of any difference between the strength of each of said predetermined electromagnetic wave strengths and the strength of the electromagnetic waves detected by said any pair of said detectors.

18. An apparatus according to claim 17, wherein said network comprises a hollow casing supporting a high voltage conductor, and said components ar components of said casing.

19. A fault location system for locating a fault position of electric insulation belonging to high voltage conductors supported by insulating supporting members within metal containers in a power apparatus, said system comprising:

a plurality of detectors for detecting electromagnetic waves at least at two detection sites in the metal containers and generating corresponding outputs; and
analysis means for storing a map of said high voltage conductors in said power apparatus, storing attenuation coefficients corresponding to each of said high voltage conductors, and analyzing the fault position on the basis of said outputs, said map and said attenuation coefficients.

20. A fault location system for locating a fault position of electric insulation belonging to high voltage conductors supported by insulating supporting members within metal containers in a power apparatus, said system comprising:
a plurality of detectors for detecting electromagnetic waves at least at two detection sites in the metal containers and generating corresponding outputs; and
analysis means for storing attenuation coefficients corresponding to each of said high voltage conductors, analyzing the fault position on the basis of said outputs and said attenuation coefficients, and displaying the fault position in terms of a time variation thereof.

21. A method of locating a fault position of electric insulating belonging to at least one of high voltage conductors supported by insulating supporting members within metal containers in a power apparatus, the method comprising:
detecting electromagnetic waves at least at two detection sites in the metal containers, said electromagnetic waves being generated by said fault in the metal container;
generating signals corresponding to said detected electromagnetic waves; and
analyzing said fault position on the basis of attenuation coefficients of the electromagnetic waves propagated between said detection sites and said signals.

22. A method according to claim 21 wherein said analysis further includes storing attenuation coefficients.

23. A method according to claim 21, wherein said analysis further includes storing a map corresponding to said high voltage conductors.

24. A method according to claim 21, further including displaying said fault position in terms of the time variation thereof.

25. A method according to claim 21, wherein said analysis further includes calculating a difference between strengths of electromagnetic waves detected at said detection sites, and comparing said difference between the strengths of electromagnetic waves with a propagation amount based on the attenuation coefficient between said detection sites so as to locate the fault position.

26. A method according to claim 21, wherein said analysis further includes calculating propagation curves of said electromagnetic waves between said detection sites on the basis of said attenuation coefficients and calculating an intersection point of said propagation curves, thereby determining the location of said fault.

27. A method according to claim 26, wherein the step of analyzing included determining the fault position on the basis of predetermined attenuation coefficients for individual components of said power apparatus.

28. A method according to claim 2, wherein said predetermined attenuation coefficients include attenuation coefficients for the insulating supporting members and attenuation coefficients for said metal containers.

29. A method of locating a fault position of electric insulating belonging to at leas tone of high voltage conductors supported by insulating supporting members within metal containers in a power apparatus, the method comprising:

detecting electromagnetic waves at least at two detection sites in the metal containers, said electromagnetic waves being generated by said fault in the metal container;

generating signals corresponding to said detected electromagnetic waves; and analyzing said signals to locate said fault position, said analysis involving storing attenuation coefficients of the electromagnetic waves propagated between said detection sites, and determining said fault position on the basis of said attenuation coefficients and said signals.

30. A method of locating a fault position of electric insulating belonging to at least one of high voltage conductors supported by insulating supporting members within metal containers in a power apparatus, the method comprising:

detecting electromagnetic waves at least at two detection sites in the metal containers, said electromagnetic waves being generated by said fault in the metal containers;

generating signals corresponding to said detected electromagnetic waves; and analyzing said signals to locate said fault position, said analysis involving storing a map corresponding to attenuation coefficients of the electromagnetic waves for predetermined components of said power apparatus located between said detection sites and determining said fault position on the basis of said attenuation coefficients and said signals.

31. A method of locating a fault position of electric insulation belonging to at least one of high voltage conductors supported by insulating supporting members within metal containers in a power apparatus, the method comprising:

detecting electromagnetic waves at least at two detection sites in the metal containers, said electromagnetic waves being generated by said fault in the metal container;

generating signals corresponding to said detected electromagnetic waves; and analyzing said signals to locate said fault position, said analysis involving displaying the location of said fault position in terms of time variations of the electromagnetic waves propagated between said detection sites.

32. A method of locating a fault position of electric insulation belonging to at least one of high voltage conductors supported by insulating supporting members within metal containers in a power apparatus, the method comprising:

detecting electromagnetic waves at least at two detection sites in the metal containers, said electromagnetic waves being generated by said fault in the metal containers;

generating signal corresponding to said detected electromagnetic waves; and analyzing said signals to locate said fault position, said analysis involving calculating propagation curves of said electromagnetic waves propagated between said detection sites on the basis of attenuation coefficients of the electromagnetic waves propagated between said detection sites and said signals, and calculating an intersection point of said propagation curves, thereby determining the location of said fault position.

* * * * *